United States Patent
Watanabe et al.

(10) Patent No.: US 9,466,591 B2
(45) Date of Patent: *Oct. 11, 2016

(54) SEMICONDUCTOR DEVICE

(71) Applicant: Renesas Electronics Corporation, Tokyo (JP)

(72) Inventors: Shinpei Watanabe, Tokyo (JP); Shinichi Uchida, Tokyo (JP); Tadashi Maeda, Tokyo (JP); Shigeru Tanaka, Tokyo (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/989,661

(22) Filed: Jan. 6, 2016

(65) Prior Publication Data

US 2016/0118368 A1 Apr. 28, 2016

Related U.S. Application Data

(63) Continuation of application No. 14/522,481, filed on Oct. 23, 2014, now Pat. No. 9,252,200.

(30) Foreign Application Priority Data

Nov. 8, 2013 (JP) .................................. 2013-232024

(51) Int. Cl.
*H01L 49/02* (2006.01)
*H01L 25/065* (2006.01)
(Continued)

(52) U.S. Cl.
CPC ..... *H01L 25/0657* (2013.01); *H01L 23/49575* (2013.01); *H01L 23/5227* (2013.01); *H01L 23/62* (2013.01); *H01L 23/645* (2013.01); *H01L 24/32* (2013.01); *H01L 24/73* (2013.01); *H01L 27/0617* (2013.01); *H01L 28/10* (2013.01); *H04B 5/005* (2013.01);
(Continued)

(58) Field of Classification Search
CPC .................... H01L 28/10; H01L 2924/19042; H01L 2924/1206
See application file for complete search history.

(56) References Cited

U.S. PATENT DOCUMENTS

2013/0127033 A1 5/2013 Nakashiba et al.

FOREIGN PATENT DOCUMENTS

JP 2011-054800 A 3/2011

OTHER PUBLICATIONS

U.S. Notice of Allowance dated Sep. 24, 2015 in U.S. Appl. No. 14/522,481.

*Primary Examiner* — Amar Movva
(74) *Attorney, Agent, or Firm* — McGinn IP Law Group, PLLC

(57) ABSTRACT

A semiconductor device includes a first semiconductor chip that includes a first main surface, a first inductor formed on the first main surface, and a first external connection terminal formed on the first main surface; a second semiconductor chip that includes a second main surface, a second inductor formed on the second main surface, a second external connection terminal formed on the second main surface; and a first insulating film that is located between the first semiconductor chip and the second semiconductor chip, wherein the first semiconductor chip and the second semiconductor chip overlap each other such that the first main surface and the second main face each other, the semiconductor device includes a facing region in which the first semiconductor chip and the second semiconductor chip overlap each other when seen in a plan view.

12 Claims, 28 Drawing Sheets

(51) Int. Cl.
*H04B 5/00* (2006.01)
*H01L 23/522* (2006.01)
*H01L 23/64* (2006.01)
*H01L 27/06* (2006.01)
*H01L 23/495* (2006.01)
*H01L 23/00* (2006.01)
*H01L 23/62* (2006.01)
H01L 23/31 (2006.01)
H01L 27/092 (2006.01)

(52) U.S. Cl.
CPC ...... *H01L 23/3185* (2013.01); *H01L 27/0922* (2013.01); *H01L 2224/04042* (2013.01); *H01L 2224/05554* (2013.01); *H01L 2224/05567* (2013.01); *H01L 2224/2919* (2013.01); *H01L 2224/32145* (2013.01); *H01L 2224/32245* (2013.01); *H01L 2224/48091* (2013.01); *H01L 2224/48247* (2013.01); *H01L 2224/48465* (2013.01); *H01L 2224/73215* (2013.01); *H01L 2224/73265* (2013.01); *H01L 2224/92147* (2013.01); *H01L 2224/92247* (2013.01); *H01L 2225/06531* (2013.01); *H01L 2225/06562* (2013.01); *H01L 2924/1206* (2013.01); *H01L 2924/19042* (2013.01)

FIG. 12A (B-B')
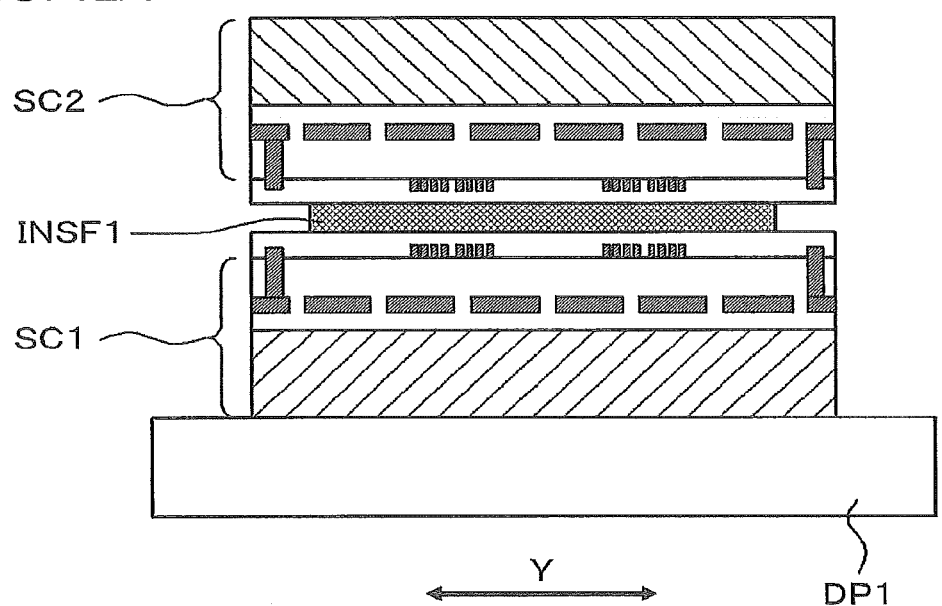
FIG. 12B (A-A')
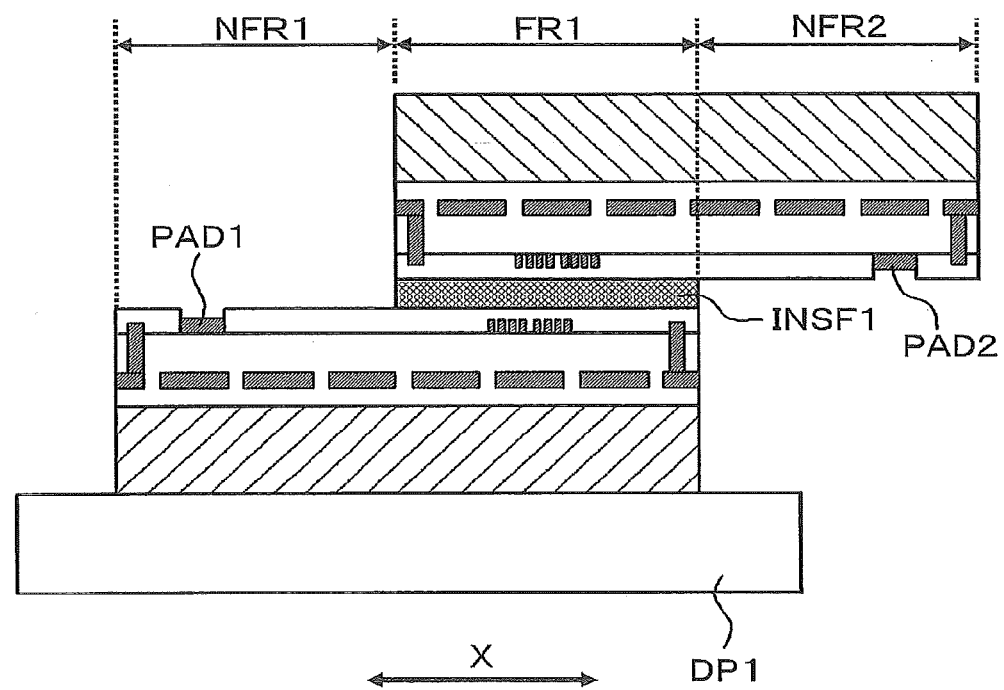

FIG. 16A (B-B′)
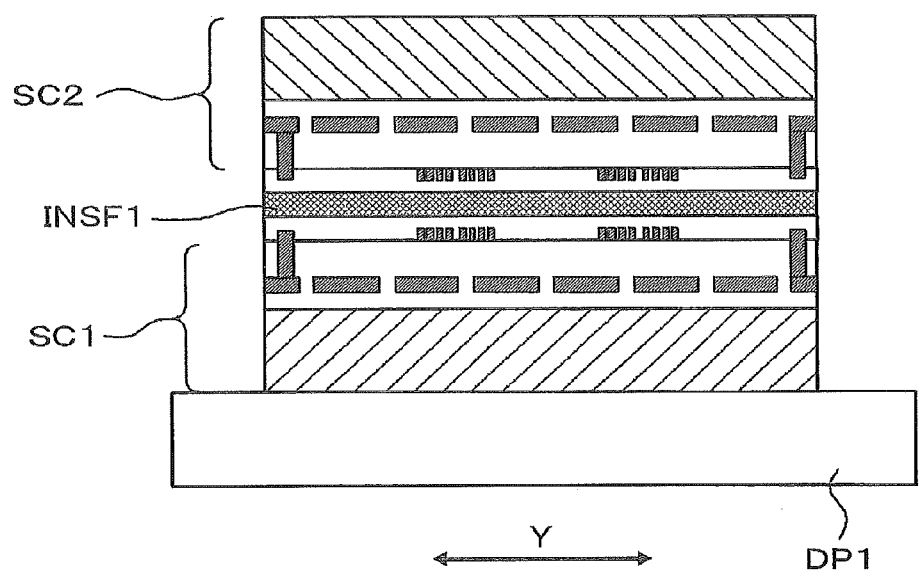
FIG. 16B (A-A′)
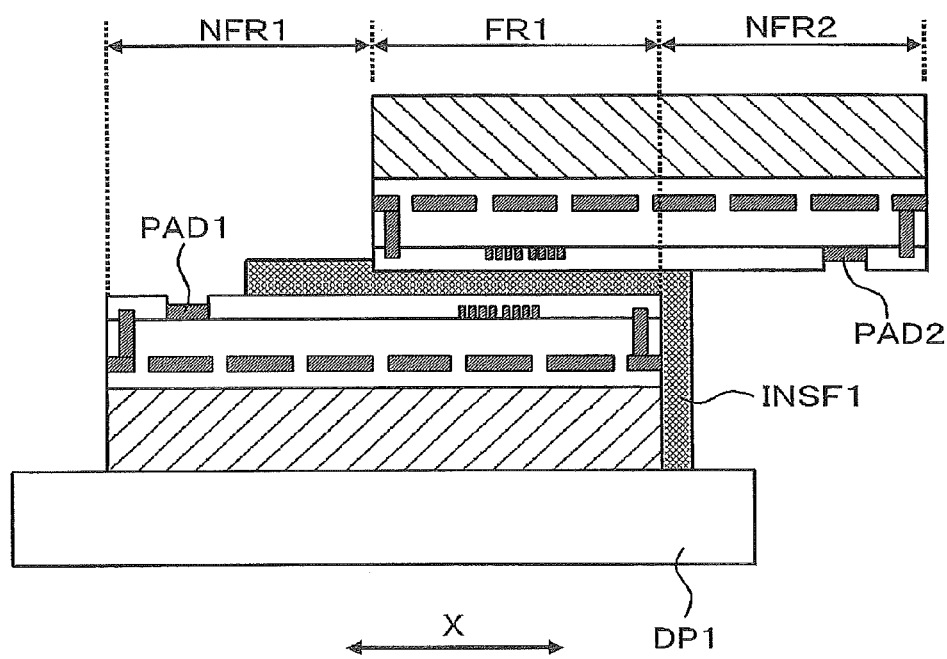

FIG. 17A (B-B')
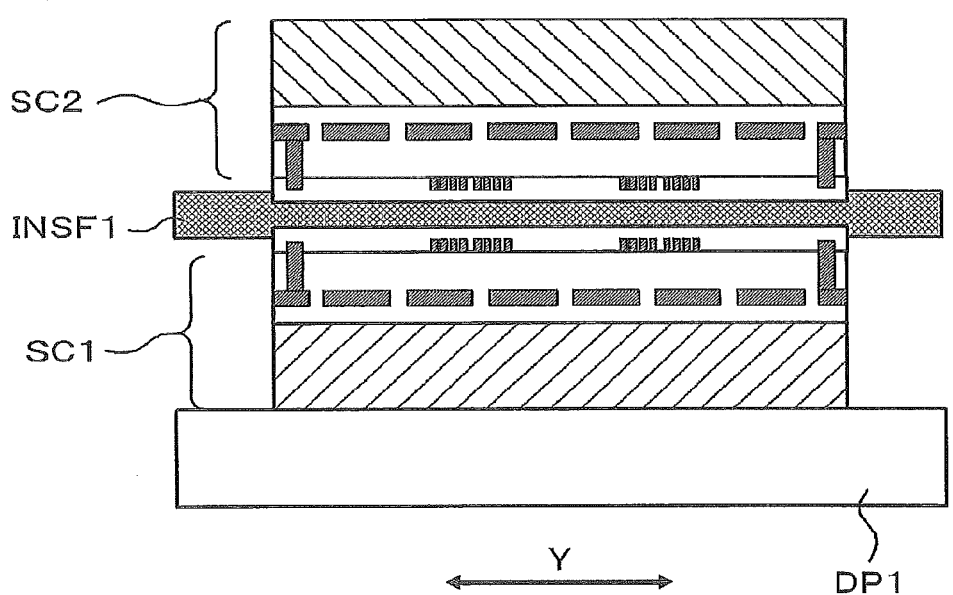
FIG. 17B (A-A')
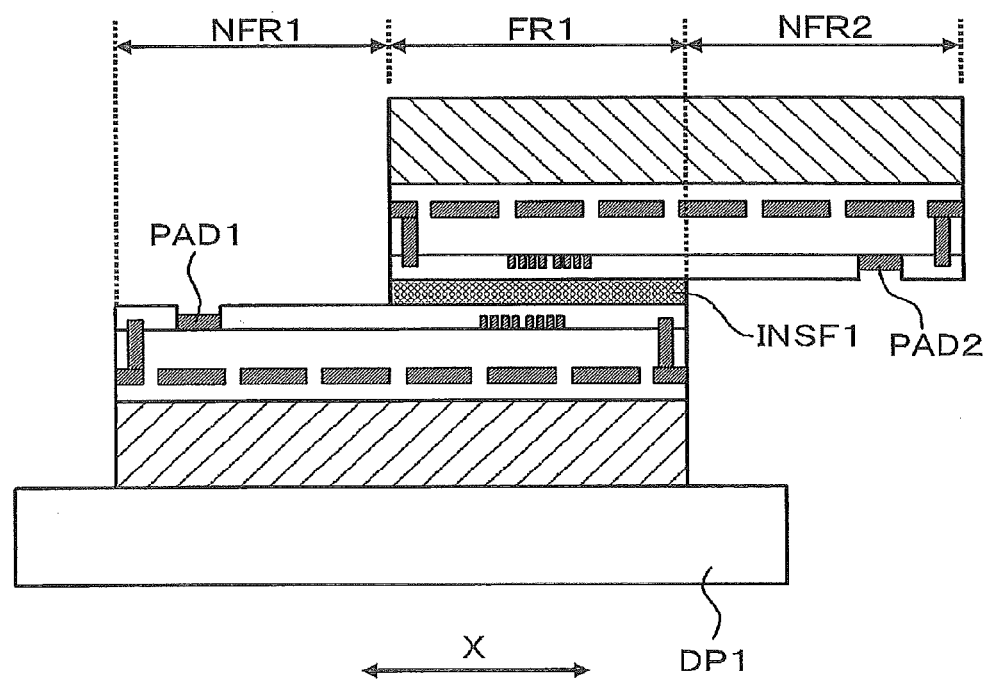

FIG. 19A (B-B')
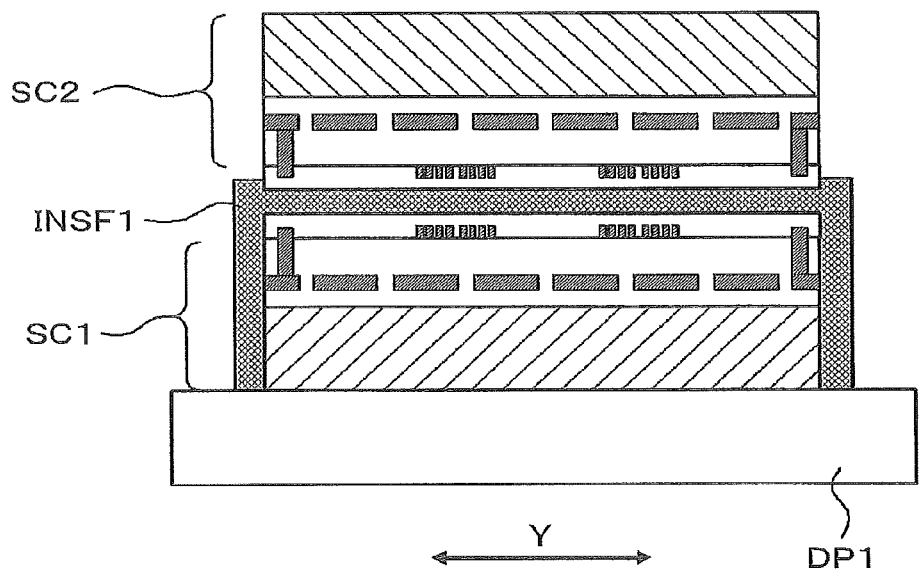
FIG. 19B (A-A')
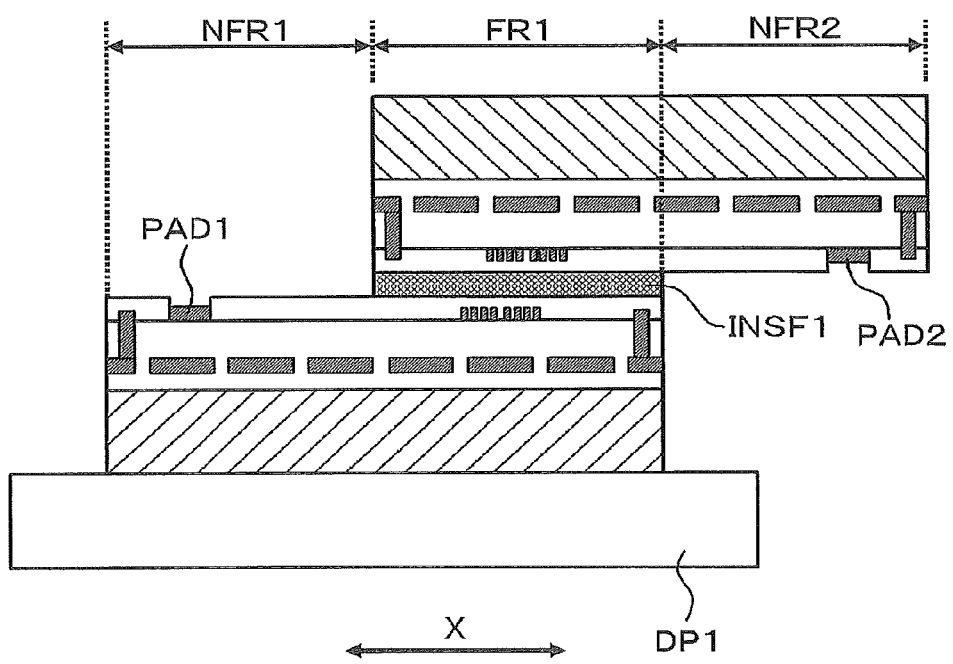

FIG. 25A (B-B')
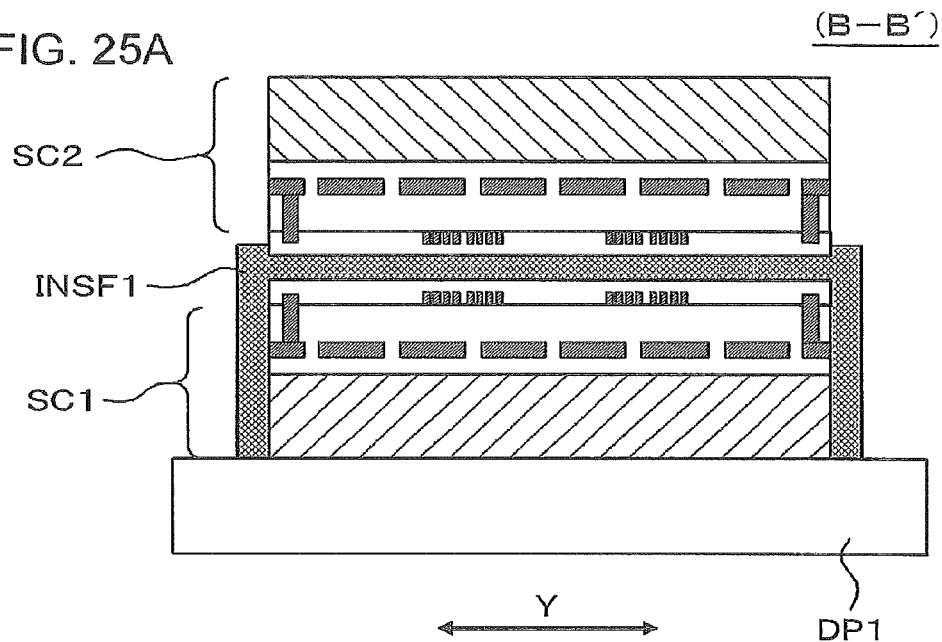
FIG. 25B (A-A')
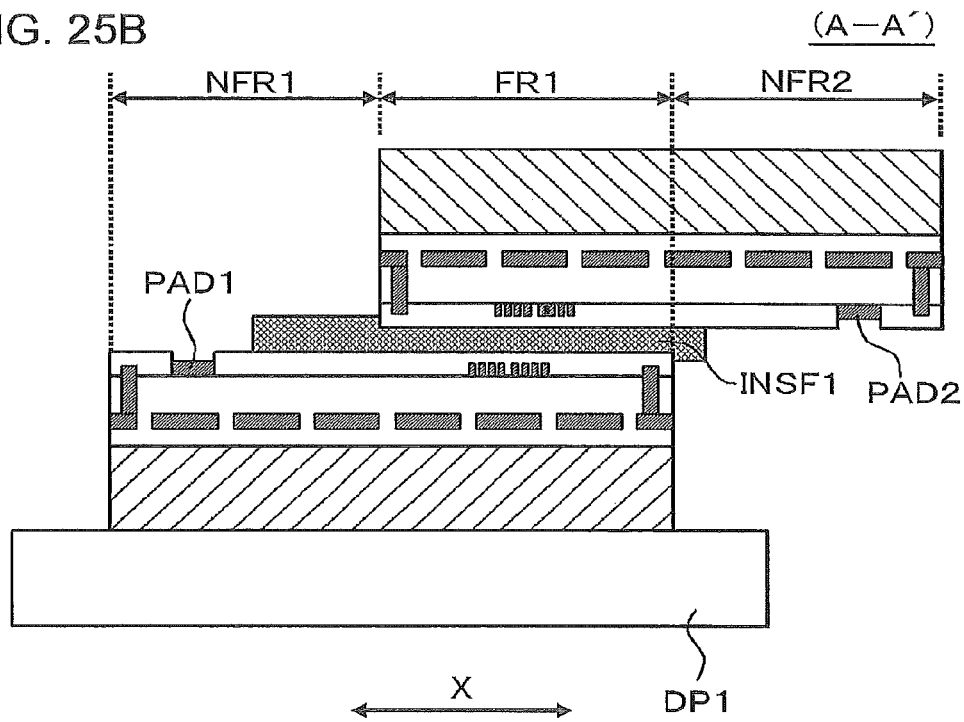

SEMICONDUCTOR DEVICE

The present application is a Continuation Application of U.S. patent application Ser. No. 14/522,481, filed on Oct. 23, 2014, which is based on Japanese Patent Application No. 2013-232024 filed on Nov. 8, 2013, the entire contents of which are hereby incorporated by reference.

BACKGROUND

1. Technical Field

The present invention relates to a semiconductor device, and to a technique applicable to a semiconductor device in which a signal is transmitted and received between, for example, two semiconductor chips.

2. Related Art

When a signal is transmitted between two semiconductor chips in a non-contact manner, a photo-coupler is often used. On the other hand, Japanese Unexamined Patent Publication No. 2011-54800 discloses a technique in which inductors are provided in multilayer interconnect layers of two semiconductor chips and these inductors are caused to face each other, thereby allowing a signal to be transmitted between the two semiconductor chips in a non-contact manner. In Japanese Unexamined Patent Publication No. 2011-54800, the two semiconductor chips overlap each other in a direction in which the multilayer interconnect layers face each other. Japanese Unexamined Patent Publication No. 2011-54800 discloses that an insulating adhesive layer may be provided between these two semiconductor chips.

When operating voltages of two semiconductor chips are different from each other, there is the possibility of a dielectric breakdown occurring between the two semiconductor chips. On the other hand, when an insulating film is provided between two semiconductor chips, a dielectric withstand voltage is improved. However, in this case, there is the possibility of each interface formed between the two semiconductor chips, the insulating film and a resin becoming the starting point of a dielectric breakdown. For this reason, even when the above-mentioned interface becomes the starting point of a dielectric breakdown, it is preferable to reduce the likelihood of a dielectric breakdown occurring between the two semiconductor chips.

Other problems and novel features will be made clearer from the description and the accompanying drawings of the present specification.

SUMMARY

In one embodiment, a first inductor is formed in a first multilayer interconnect layer of a first semiconductor chip, and a second inductor is formed in a second multilayer interconnect layer of a second semiconductor chip. The first semiconductor chip and the second semiconductor chip overlap each other in a direction in which the first multilayer interconnect layer and the second multilayer interconnect layer face each other. A first insulating film is provided between the first semiconductor chip and the second semiconductor chip. In a case where a region in which the first semiconductor chip and the second semiconductor chip overlap each other when seen in a plan view is set to a facing region, at least a portion of an edge of the first insulating film does not overlap an edge of the facing region.

According to the embodiment, even when each interface formed between the insulating film, the semiconductor chips, and a resin becomes the starting point of a dielectric breakdown, a dielectric breakdown is not likely to occur between two semiconductor chips.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 12A and 12B are cross-sectional views illustrating a configuration of a semiconductor device according to Modified Example 4.

FIGS. 16A and 16B are cross-sectional views illustrating a configuration of a semiconductor device according to Modified Example 8.

FIGS. 17A and 17B are cross-sectional views illustrating a configuration of a semiconductor device according to Modified Example 9.

FIGS. 19A and 19B are cross-sectional views illustrating a configuration of a semiconductor device according to Modified Example 11.

FIGS. 25A and 25B are cross-sectional views illustrating a configuration of a semiconductor device according to Modified Example 17.

DETAILED DESCRIPTION

Figure 1:
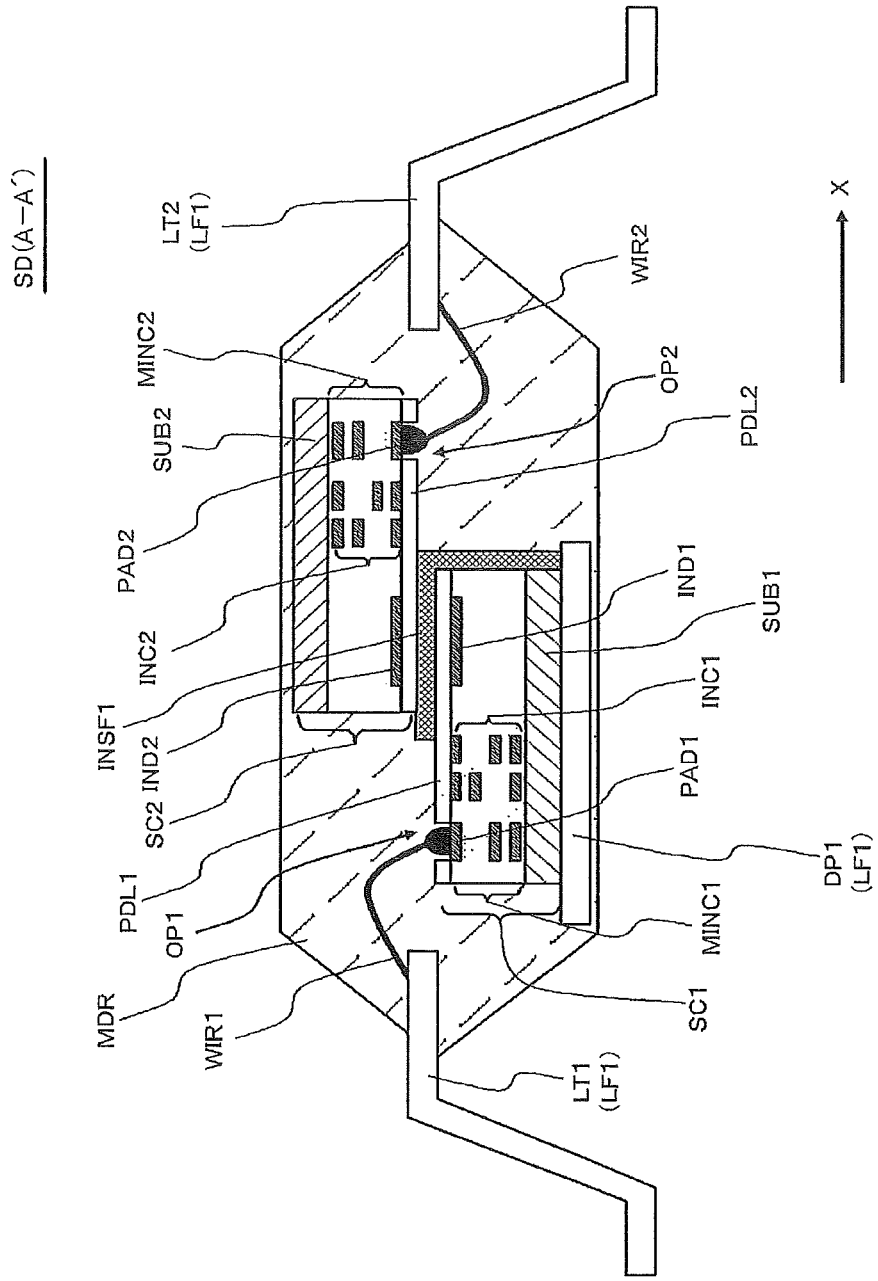
FIG. 1 is a cross-sectional view illustrating a configuration of a semiconductor device according to an embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, embodiments of the present invention will be described with reference to the accompanying drawings. In all the drawings, like elements are referenced by like reference numerals and descriptions thereof will not be repeated.

EMBODIMENT

Figure 2:
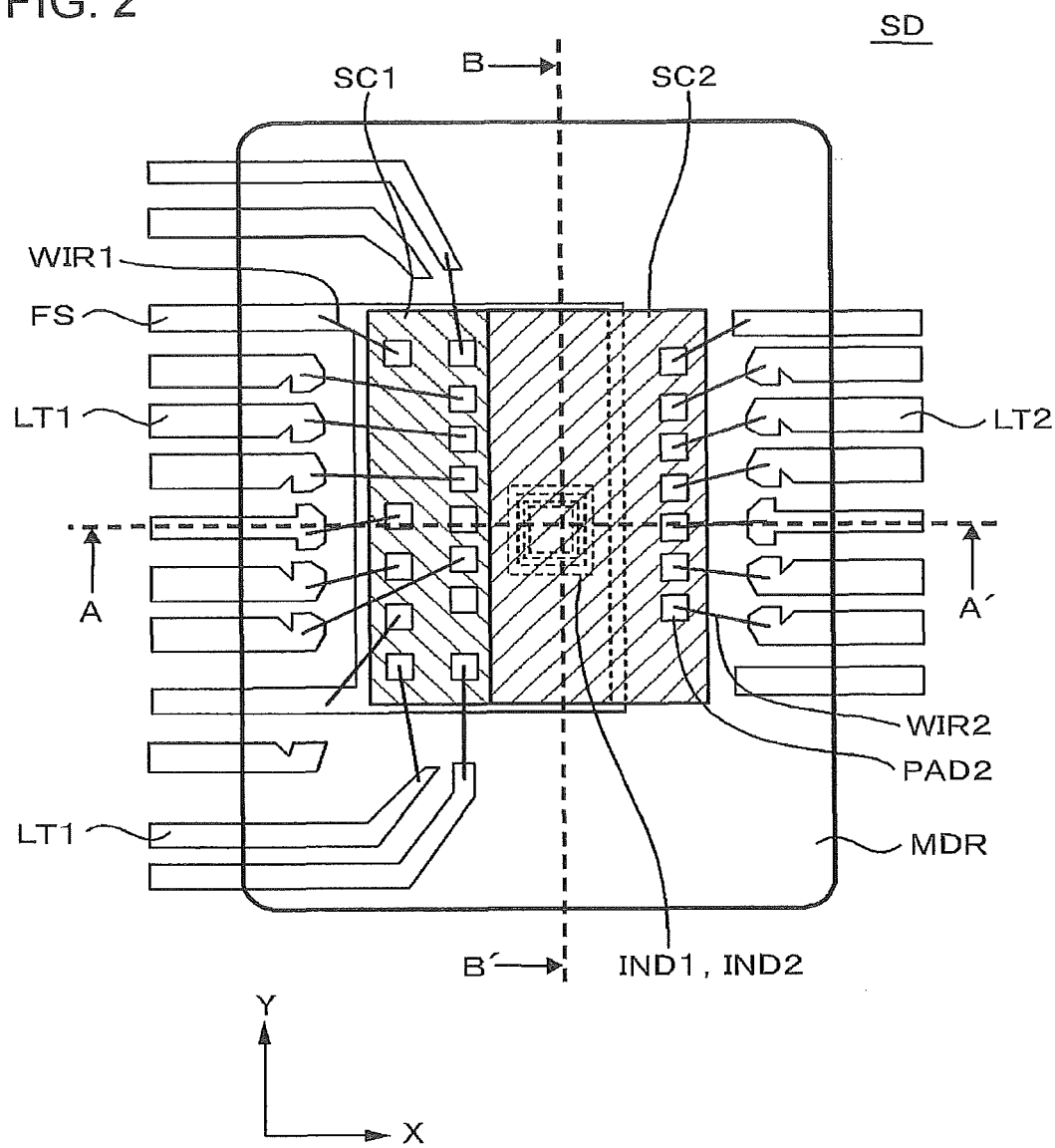
FIG. 2 is a plan view illustrating the semiconductor device.
Figure 3:
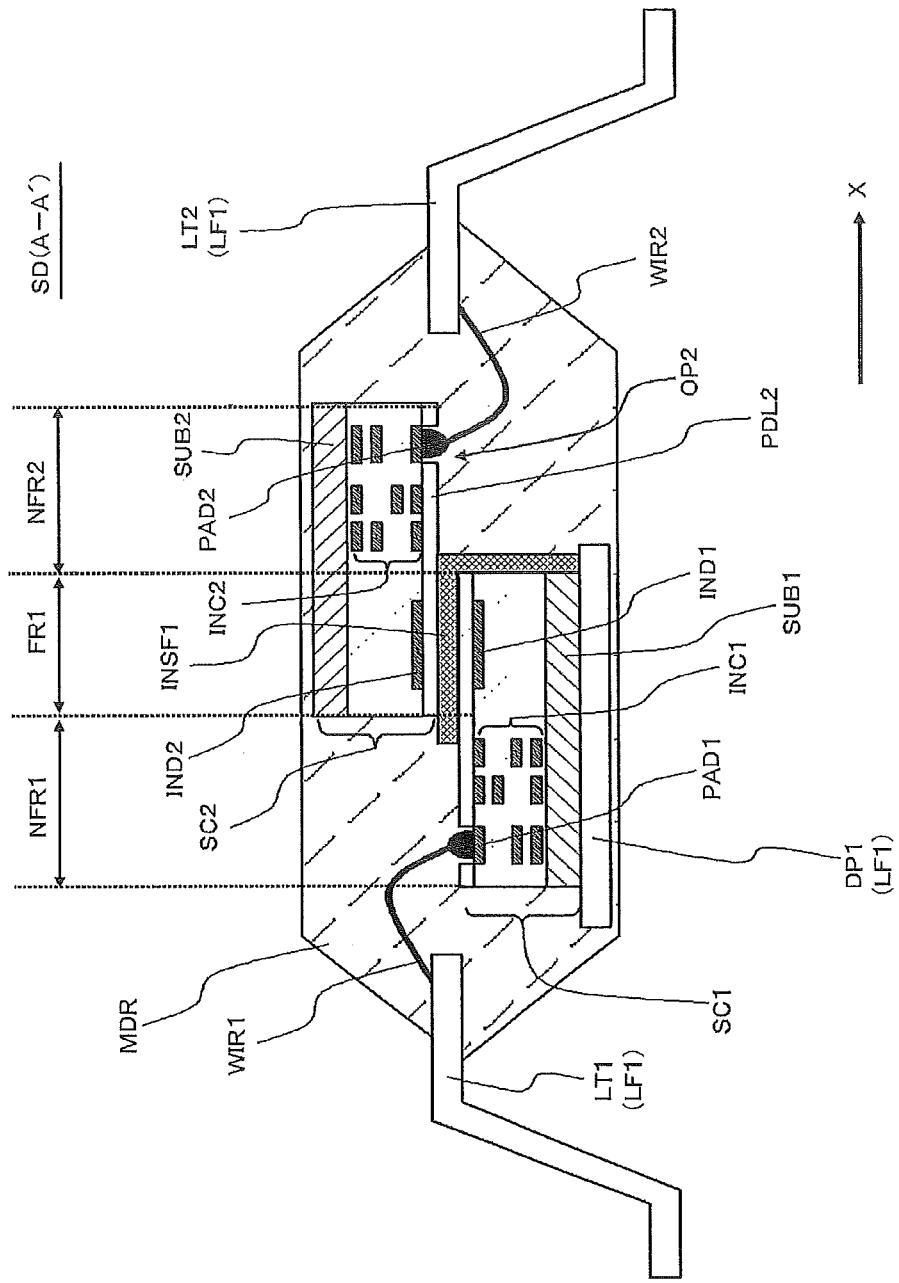
FIG. 3 is a diagram in which signs are added and deleted from FIG. 1.

FIG. 1 is a cross-sectional view illustrating a configuration of a semiconductor device SD according to an embodiment. FIG. 2 is a plan view illustrating the semiconductor device SD. FIG. 1 corresponds to cross-section A-A' of FIG. 2. FIG. 3 is the same as FIG. 1, but is a diagram in which signs are added and deleted. Meanwhile, in FIG. 2, a first insulating film INSF1 is omitted.

The semiconductor device SD includes a first semiconductor chip SC1 and a second semiconductor chip SC2. The first semiconductor chip SC1 includes a first multilayer interconnect layer MINC1 and a first inductor IND1. The first multilayer interconnect layer MINC1 is formed on a first substrate SUB1, and the first inductor IND1 is formed in the first multilayer interconnect layer MINC1. The second semiconductor chip SC2 includes a second multilayer interconnect layer MINC2 and a second inductor IND2. The second multilayer interconnect layer MINC2 is formed on a second substrate SUB2. The second inductor IND2 is formed in the second multilayer interconnect layer MINC2. The first semiconductor chip SC1 and the second semiconductor chip SC2 overlap each other in a direction in which the first multilayer interconnect layer MINC1 and the second multilayer interconnect layer MINC2 face each other. In addition, the first inductor IND1 and the second inductor IND2 overlap each other when seen in a plan view.

As shown in FIG. 3, the semiconductor device SD includes a facing region FR1 in which the first semiconductor chip SC1 and the second semiconductor chip SC2 face each other. In addition, the first semiconductor chip SC1 and the second semiconductor chip SC2 each include non-facing regions (first non-facing region NFR1 and second non-facing region NFR2) which do not face each other. The first non-facing region NFR1, the facing region FR1, and the second non-facing region NFR2 are located in this order along a first direction (X direction in the drawing).

The first multilayer interconnect layer MINC1 includes a first electrode pad PAD1 (first external connection terminal) in the first non-facing region NFR1, and the second multilayer interconnect layer MINC2 includes a second electrode pad PAD2 (second external connection terminal) in the second non-facing region NFR2. The first electrode pad PAD1 and the second electrode pad PAD2 are, for example, electrode pads which are formed in an uppermost interconnect layer. In addition, in the present embodiment, the first inductor IND1 and the second inductor IND2 are formed in the uppermost interconnect layer.

In addition, the first insulating film INSF1 is provided between the first semiconductor chip SC1 and the second semiconductor chip SC2. The thickness of the first insulating film INSF1 is, for example, equal to or greater than 3 μm and equal to or less than 50 μm. However, the thickness of the first insulating film INSF1 may fall outside of this range. The first insulating film INSF1 is, for example, a die attach film (DAF). However, the first insulating film INSF1 may be another insulating film.

When seen from a direction perpendicular to the first semiconductor chip SC1, at least a portion of the edge of the first insulating film INSF1 does not overlap the edge of the facing region FR1. More specifically, one end of the first insulating film INSF1 is located outside the first semiconductor chip SC1 and inside the second semiconductor chip SC2, in the first direction (X direction in the drawing). This end is bent toward the lateral side of the first semiconductor chip SC1. In the example shown in the drawing, the end of the first insulating film INSF1 is located along the lateral side of the first semiconductor chip SC1. It is preferable that the end of the first insulating film INSF1 reach a chip mounting portion DP1 (described later).

In the present embodiment, regarding the potential of an electrical signal which is input to the first semiconductor chip SC1 and the potential of an electrical signal which is input to the second semiconductor chip SC2, there are cases in which the amplitudes of the electrical signals (difference between a potential indicating 0 and a potential indicating 1) may be different from each other, the reference potentials of the electrical signals (potential indicating 0) may be different from each other, the amplitudes of the electrical signals may be different from each other and the reference potentials of the electrical signals may be different from each other, and the like. For example, the amplitude of the electrical signal which is input to the second semiconductor chip SC2 may be 5 V, and the reference potential may be 0 V. The amplitude of the electrical signal which is input to the first semiconductor chip SC1 may be 5 V, and the reference potential may be 100 V.

In addition, the first semiconductor chip SC1 may be a semiconductor chip for power control. In this case, the second semiconductor chip SC2 is a controller chip that controls the first semiconductor chip SC1. The semiconductor chip for power control serving as the first semiconductor chip SC1 includes a power control element (for example, a transistor or a thyristor). Such a power control element may be, for example, a vertical element for causing a current to flow in the thickness direction of a substrate, and may be an element for causing a current to flow in the plane direction of the substrate. In addition, as the controller chip serving as the second semiconductor chip SC2, for example, a microcontroller (MCU: Micro Control Unit) or a microprocessor (MPU: Micro-Processing Unit) can be used.

The first multilayer interconnect layer MINC1 of the first semiconductor chip SC1 may be configured not to include interconnects other than an interconnect connected to the first inductor IND1 in the facing region FR1. In this case, an interconnect INC1 for forming a circuit in the first semiconductor chip SC1 is formed in, for example, the first non-facing region NFR1 when seen in a plan view.

In addition, the second multilayer interconnect layer MINC2 of the second semiconductor chip SC2 may be configured not to include interconnects other than an interconnect connected to the second inductor IND2 in the facing region FR1. In this case, an interconnect INC2 for forming a circuit in the second semiconductor chip SC2 is formed in, for example, the second non-facing region NFR2.

When the diameters of the first inductor IND1 and the second inductor IND2 are set to D and a distance from the first inductor IND1 to the second inductor IND2 is set to x, it is preferable that the relation of x≤D be satisfied. For example, the relation is satisfied where x=20 μm and D=200 μm.

The first semiconductor chip SC1 is mounted onto the chip mounting portion DP1 of a lead frame LF1. The second semiconductor chip SC2 is fixed onto the first semiconductor chip SC1 using the first insulating film INSF1. A first lead terminal LT1 of the lead frame LF1 and the first electrode pad PAD1 are connected to each other through a first bonding wire WIR1, and a second lead terminal LT2 and the second electrode pad PAD2 are connected to each other through a second bonding wire WIR2. Meanwhile, at least a portion of the chip mounting portion DP1 may protrude from the first semiconductor chip SC1, and the entirety of the chip mounting portion DP1 may be covered with the first semiconductor chip SC1.

The first semiconductor chip SC1, the second semiconductor chip SC2, the chip mounting portion DP1, a portion of the first lead terminal LT1, a portion of the second lead terminal LT2, the first bonding wire WIR1, and the second bonding wire WIR2 are sealed by a sealing resin MDR.

Meanwhile, the first semiconductor chip SC1 includes a first protective layer PDL1 (for example, a polyimide layer) on the first multilayer interconnect layer MINC1, and the second semiconductor chip SC2 includes a second protective layer PDL2 (for example, a polyimide layer) on the second multilayer interconnect layer MINC2. The first protective layer PDL1 has a first opening OP1 which is located on the first electrode pad PAD1, and the second protective layer PDL2 has a second opening OP2 which is located on the second electrode pad PAD2.

In addition, as shown in FIG. 2, the lead frame LF1 includes a suspended lead FS. The suspended lead FS is installed at the corner of the chip mounting portion DP1.

Figure 4:
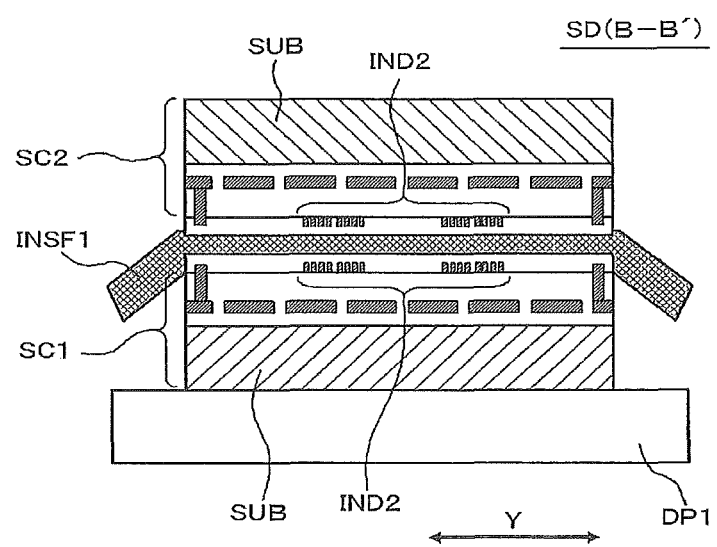
FIG. 4 is a diagram illustrating an example of cross-section B-B' of FIG. 2.

FIG. 4 is a diagram illustrating an example of cross-section B-B' of FIG. 2. The drawing shows a cross-section of the facing region FR1 of the semiconductor device SD in a direction (Y direction of FIG. 2: hereinafter, referred to as a second direction) perpendicular to the first direction (X direction) shown in FIG. 1. Meanwhile, the sealing resin MDR is omitted in the drawing.

As mentioned above, in the facing region FR1, the first insulating film INSF1 is located between the first semiconductor chip SC1 and the second semiconductor chip SC2. When seen from a direction perpendicular to the first semiconductor chip SC1, at least one end of the first insulating film INSF1 does not overlap the end of the facing region FR1 in the second direction. In the example shown in the drawing, both two ends of the first insulating film INSF1 are located outside the facing region FR1, more specifically, outside the end of the first semiconductor chip SC1 and the end of the second semiconductor chip SC2, in the second direction. A portion of the first insulating film INSF1 which is located outside the facing region FR1 is bent in a direction facing the lateral side of the first semiconductor chip SC1. In the example shown in the drawing, a portion of the first insulating film INSF1 which is located outside the facing region FR1 does not come into contact with the lateral side of the first semiconductor chip SC1.

Figure 5:
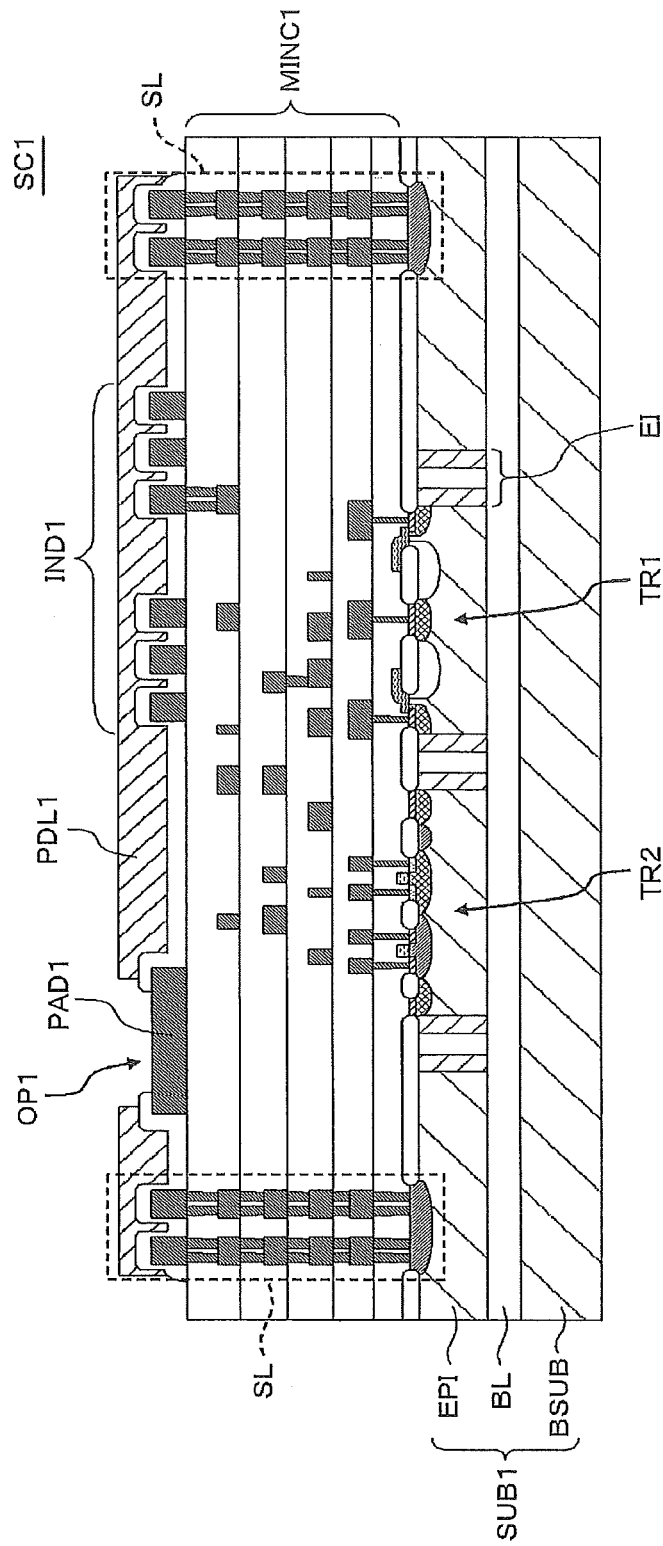
FIG. 5 is a cross-sectional view illustrating an example of a configuration of a first semiconductor chip.

FIG. 5 is a cross-sectional view illustrating an example of a configuration of the first semiconductor chip SC1. In the example shown in the drawing, the first substrate SUB1 is a silicon-on-insulator (SOI) substrate, and has a configuration in which a buried insulating layer BL made of $SiO_2$ and a semiconductor layer EPI made of silicon are laminated in this order on a base substrate BSUB made of a silicon substrate. A first transistor TRT for power control and a second transistor TR2 for signal processing are formed in the semiconductor layer EPI. A region in which the first transistor TR1 is formed and a region in which the second transistor TR2 is formed are isolated from each other by an element isolation region EI.

The first multilayer interconnect layer MINC1 is formed on the first substrate SUB1, on the first transistor TR1, and on the second transistor TR2. The first electrode pad PAD1 and the first inductor IND1 are formed in an uppermost interconnect layer of the first multilayer interconnect layer MINC1. The first protective layer PDL1 is formed on the first multilayer interconnect layer MINC1. The first protective layer PDL1 covers the first inductor IND1, but has the first opening OP1 on the first electrode pad PAD1.

In addition, the first multilayer interconnect layer MINC1 includes a seal ring SL. In the example shown in the drawing, the seal ring SL is formed in all the interconnect layers, and the lower end thereof comes into contact with the semiconductor layer EPI. When seen from a direction perpendicular to the first substrate SUB1, the seal ring SL is formed along the edge of the first substrate SUB1, and surrounds the region in which the first transistor TR1 is formed and the region in which the second transistor TR2 is formed.

Meanwhile, the second semiconductor chip SC2 is formed using, for example, a silicon substrate. An element (for example, MOS transistor) for constituting a logic circuit is formed in this silicon substrate.

FIGS. 6A, 6B, 7A, 7B, 7C, 8A, 8B, and 8C are cross-sectional views illustrating a method of manufacturing the semiconductor device SD. These cross-sectional views correspond to cross-section A-A' of FIG. 2.

First, the first semiconductor chip SC1 and the second semiconductor chip SC2 are manufactured. The first semiconductor chip SC1 and the second semiconductor chip SC2 are manufactured, for example, as follows.

First, an element isolation region (element isolation region EI in the first semiconductor chip SC1) is formed in the first substrate SUB1 in a state of a wafer. Thereby, the element forming region is isolated. Next, a gate insulating film and a gate electrode are formed in a semiconductor substrate which is located at the element forming region. The gate insulating film may be a silicon oxide film, and may be a high dielectric constant film (for example, hafnium silicate film) of which the dielectric constant is higher than that of the silicon oxide film. When the gate insulating film is a silicon oxide film, the gate electrode is formed by a polysilicon film. In addition, when the gate insulating film is a high dielectric constant film, the gate electrode is formed by a laminated film of a metal film (for example, TiN) and a polysilicon film. In addition, when the gate electrode is formed of polysilicon, a polysilicon resistor may be formed on the element isolation film in a process of forming the gate electrode.

Next, an extension region of a source and a drain is formed in the semiconductor substrate which is located at the element forming region. Next, a sidewall is formed on the sidewall of the gate electrode. Next, an impurity region serving as a source and a drain is formed in the semiconductor substrate which is located at the element forming region. In this manner, a MOS transistor (second transistor TR2 in the first semiconductor chip SC1) is formed on the semiconductor substrate.

In addition, in a process of manufacturing the first semiconductor chip SC1, the first transistor TR1 is also further formed. The second transistor TR2 may be formed by using, for example, at least a portion of the above-mentioned process.

Next, the first multilayer interconnect layer MINC1 (or the second multilayer interconnect layer MINC2) is formed on the element isolation film and on the MOS transistor. The first electrode pad PAD1 (or the second electrode pad PAD2) is formed in the uppermost interconnect layer. Next, a protective insulating film (passivation film) and the first protective layer PDL1 (or the second protective layer PDL2) are formed on the first multilayer interconnect layer MINC1. The first opening OP1 (or the second opening OP2) is formed in the protective insulating film and the first protective layer PDL1.

Thereafter, the first semiconductor chip SC1 is formed by dividing a wafer to serve as the first semiconductor chip SC1 into individual pieces. Similarly, the second semiconductor chip SC2 is also formed.

Meanwhile, before the first semiconductor chip SC1 is made into an individual piece, the first substrate SUB1 of the first semiconductor chip SC1 is polished as necessary, to thereby reduce the thickness thereof. Similarly, before the second semiconductor chip SC2 is made into an individual piece, the second substrate SUB2 of the second semiconductor chip SC2 is polished as necessary, to thereby reduce the thickness thereof.

Figure 6A:
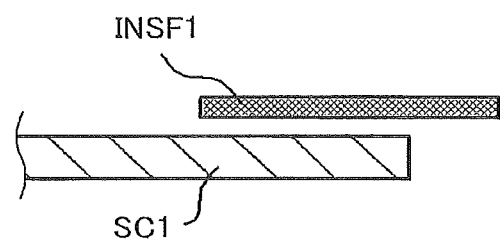
FIGS. 6A and 6B are cross-sectional views illustrating a method of manufacturing a semiconductor device.

Next, as shown in FIG. 6A, the first insulating film INSF1 is provided on a region of the first semiconductor chip SC1 in which the second semiconductor chip SC2 is mounted. In this case, at least a portion of the end of the first insulating film INSF1 is caused to protrude from the first semiconductor chip SC1. In this case, such an end may be located along the lateral side of the first semiconductor chip SC1. When the first insulating film INSF1 is formed of a DAF, the DAF functions as an adhesive layer as well, and thus the end of the first insulating film INSF1 can be easily located along (attached to) the lateral side of the first semiconductor chip SC1.

In addition, when the first insulating film INSF1 is provided, as shown in FIG. 4, both two ends of the first insulating film INSF1 are located outside the facing region FR1 in the second direction.

Figure 6B:
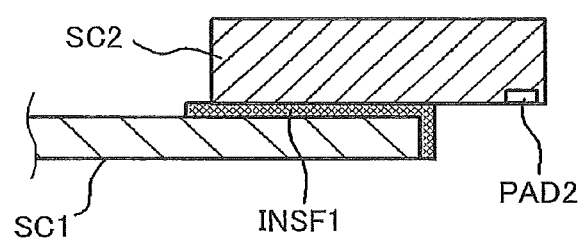

Next, as shown in FIG. 6B, the second semiconductor chip SC2 is mounted onto the first semiconductor chip SC1.

Figure 7A:
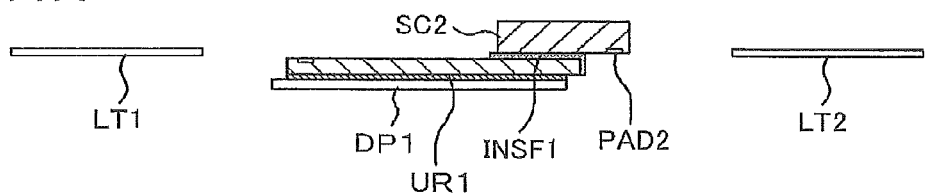
FIGS. 7A to 7C are cross-sectional views illustrating a method of manufacturing a semiconductor device.

Next, as shown in FIG. 7A, a laminated body of the first semiconductor chip SC1 and the second semiconductor chip SC2 is mounted on the chip mounting portion DP1 of the lead frame LF1, using a fixed layer UR. The fixed layer UR is for example, a DAF, but may be a silver paste or solder.

Figure 7B:
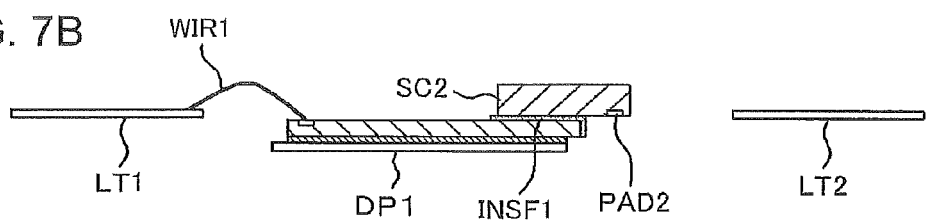

Next, as shown in FIG. 7B, the first electrode pad PAD1 of the first semiconductor chip SC1 is connected to the first lead terminal LT1 of the lead frame LF1, using the first bonding wire WIR1. In this case, it is preferable to fix one end of the first bonding wire WIR1 to the first electrode pad PAD1 and then fix the other end of the first bonding wire WIR1 to the first lead terminal LT1.

Figure 7C:
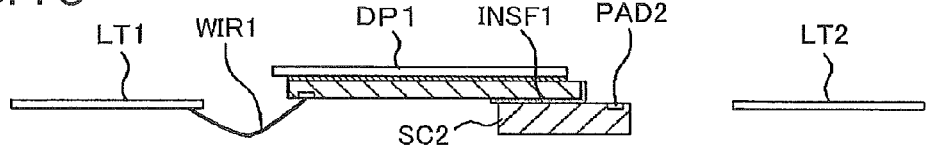

Thereafter, as shown in FIG. 7C, the lead frame LF1 is turned upside down.

Figure 8A:
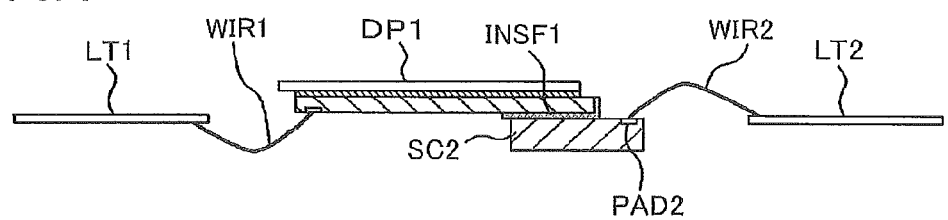
FIGS. 8A to 8C are cross-sectional views illustrating a method of manufacturing a semiconductor device.

Next, as shown in FIG. 8A, the second electrode pad PAD2 of the second semiconductor chip SC2 is connected to the second lead terminal LT2 of the lead frame LF1, using the second bonding wire WIR2. In this case, it is preferable to fix the other end of the second bonding wire WIR2 to the second lead terminal LT2 and then fix one end of the second bonding wire WIR2 to the second electrode pad PAD2.

Figure 8B:
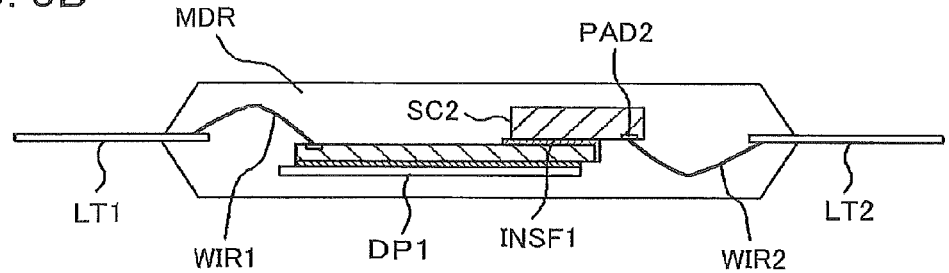

Thereafter, as shown in FIG. 8B, the lead frame LF1 is turned upside down. Thereby, the transport of the lead frame LF1 is facilitated. Next, the sealing resin MDR is formed using a sealing mold.

Figure 8C:
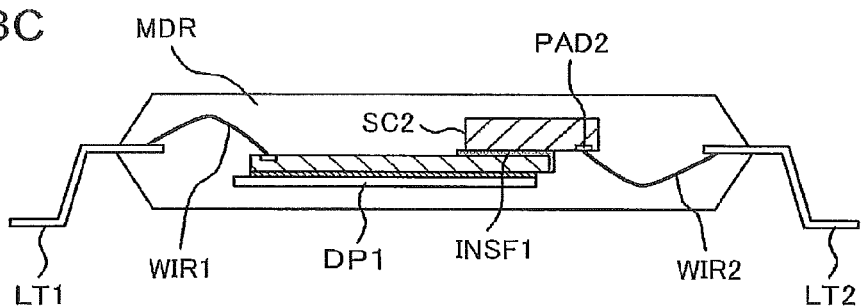

Next, as shown in FIG. 8C, a portion of the first lead terminal LT1 and the second lead terminal LT2 which is located outside the sealing resin MDR is deformed, to form a terminal.

Meanwhile, after the first semiconductor chip SC1 is mounted onto the chip mounting portion DP, the second semiconductor chip SC2 may be mounted on the first semiconductor chip SC1.

Next, effects of the present embodiment will be described. According to the present embodiment, as shown in FIG. 4, at least one end of the first insulating film INSF1 does not overlap the end of the facing region FR1 in the second direction. Therefore, a path from the first semiconductor chip SC1 to the second semiconductor chip SC2 through the surface, the end face, and the back face of the first insulating film INSF1 increases in length in the second direction. Therefore, it is possible to prevent a dielectric breakdown from occurring between the first semiconductor chip SC1 and the second semiconductor chip SC2, with the interface between the first insulating film INSF1 and the first semiconductor chip SC1 or the interface between the first insulating film INSF1 and the second semiconductor chip SC2 as a starting point.

Particularly, in the example shown in FIG. 4, both two ends of the first insulating film INSF1 are located outside the facing region FR1, more specifically, outside the end of the first semiconductor chip SC1 and the end of the second semiconductor chip SC2, in the second direction (Y direction). For this reason, the path from the first semiconductor chip SC1 to the second semiconductor chip SC2 through the surface, the end face, and the back face of the first insulating film INSF1 further increases in length in the second direction. Therefore, it is possible to prevent a dielectric breakdown from occurring between the first semiconductor chip SC1 and the second semiconductor chip SC2.

In addition, a portion of the first insulating film INSF1 which is located outside the first semiconductor chip SC1 and the second semiconductor chip SC2 is bent in a direction facing the lateral side of the first semiconductor chip SC1. Therefore, it is possible to prevent the first insulating film INSF1 from interfering with other components (for example, lead frame LF1) of the semiconductor device SD in the second direction.

In addition, according to the present embodiment, as shown in FIG. 1, at least one end of the first insulating film INSF1 is located outside the first semiconductor chip SC1 in the first direction. For this reason, the path from the first semiconductor chip SC1 to the second semiconductor chip SC2 through the surface, the end face, and the back face of the first insulating film INSF1 increases in length in the first direction. Therefore, it is possible to prevent a dielectric breakdown from occurring between the first semiconductor chip SC1 and the second semiconductor chip SC2. Particularly, in the present embodiment, the end of the first insulating film INSF1 is bent toward the lateral side of the first semiconductor chip SC1. For this reason, it is possible to prevent the end of the first insulating film INSF1 from interfering with the second bonding wire WIR2. Such an effect increases particularly in a case where the end of the first insulating film INSF1 is located along the lateral side of the first semiconductor chip SC1.

Modified Example 1

Figure 9A:
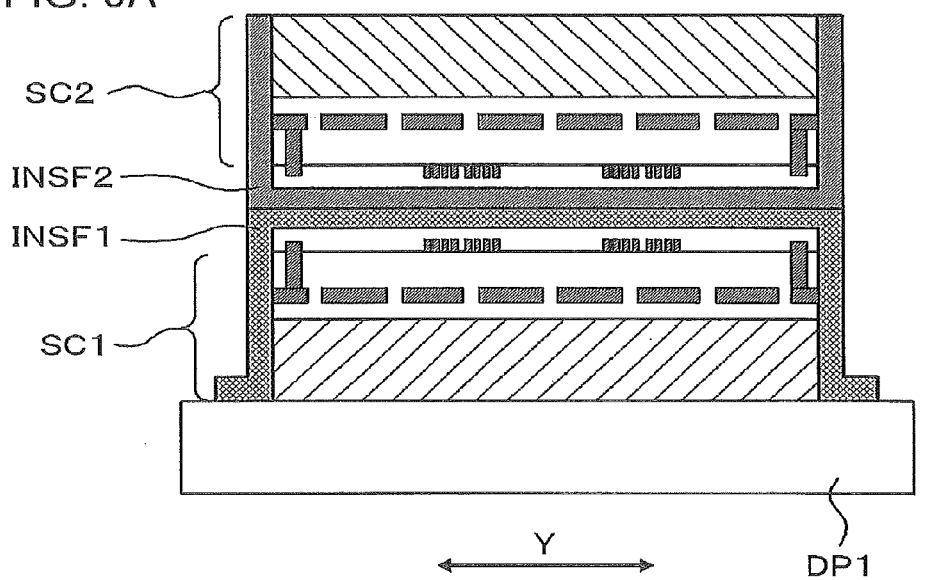
FIGS. 9A and 9B are cross-sectional views illustrating a configuration of a semiconductor device according to Modified Example 1.
Figure 9B:
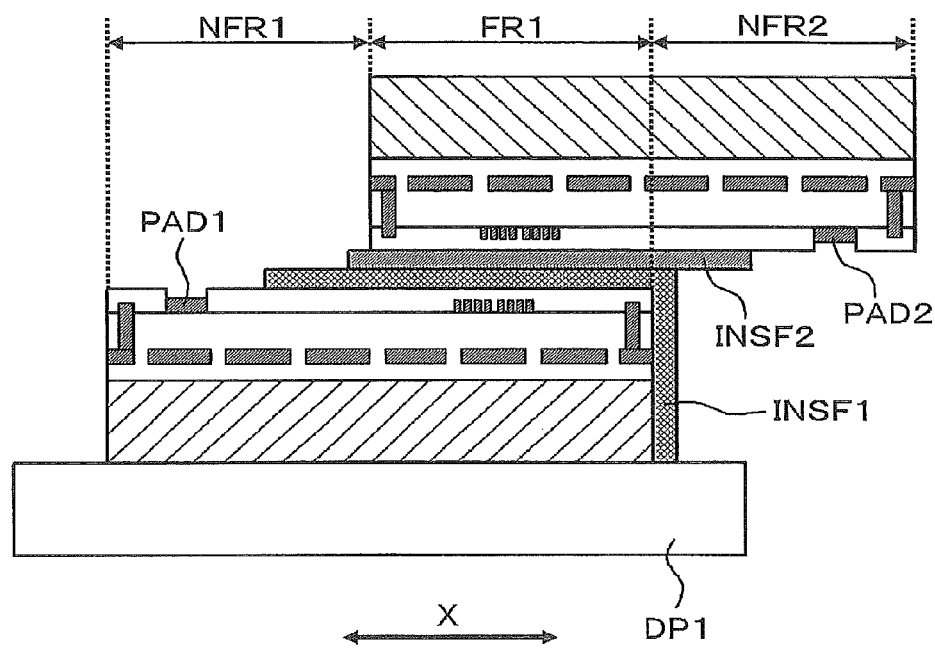

FIGS. 9A and 9B are cross-sectional views illustrating a configuration of a semiconductor device SD according to Modified Example 1. FIG. 9A corresponds to cross-section B-B' of FIG. 2, and FIG. 9B corresponds to cross-section A-A' of FIG. 2. The semiconductor device SD according to the present modified example has the same configuration as that of the semiconductor device SD according to the embodiment, except for the following points.

First, as shown in FIG. 9A, a portion of the first insulating film INSF1 which protrudes from the first semiconductor chip SC1 is located along the lateral side of the first semiconductor chip SC1 in the second direction (Y direction).

As shown in FIGS. 9A and 9B, a second insulating film INSF2 is provided between the first insulating film INSF1 and the second semiconductor chip SC2. The second insulating film INSF2 is formed of, for example, a DAF. As shown in FIG. 9A, both ends of the second insulating film INSF2 protrude from the second semiconductor chip SC2 in the second direction, and are located along the lateral sides of the second semiconductor chip SC2.

As shown in FIG. 9B, the side of the end of the second insulating film INSF2 which faces the second electrode pad PAD2 in the first direction (X direction) protrudes in a direction approaching the second electrode pad PAD2 from the facing region FR1 in which the first semiconductor chip SC1 and the second semiconductor chip SC2 face each other.

A method of manufacturing the semiconductor device SD according to the present modified example is the same as the method of manufacturing the semiconductor device SD according to the embodiment, except that the first insulating film INSF1 is attached to the first semiconductor chip SC1, the second insulating film INSF2 is further attached to the second semiconductor chip SC2, and then the second semiconductor chip SC2 is fixed to the first semiconductor chip SC1.

In the present modified example, the same effect as that of the embodiment is also obtained. In addition, since the second insulating film INSF2 is provided between the first insulating film INSF1 and the second semiconductor chip SC2, it is possible to further increase a withstand voltage between the first semiconductor chip SC1 and the second semiconductor chip SC2.

Modified Example 2

Figure 10A:
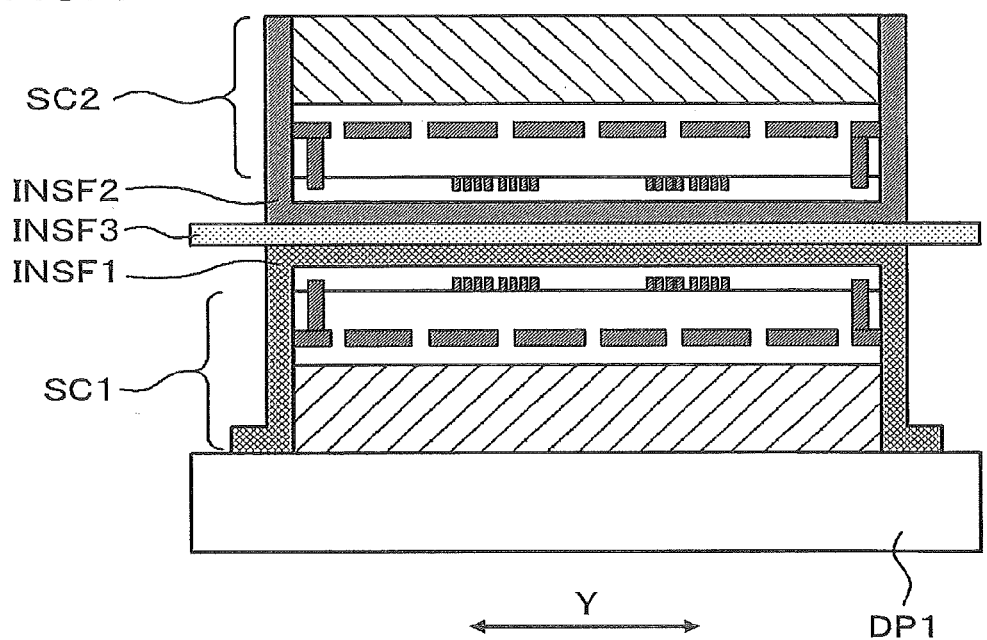
FIGS. 10A and 10B are cross-sectional views illustrating a configuration of a semiconductor device according to Modified Example 2.
Figure 10B:
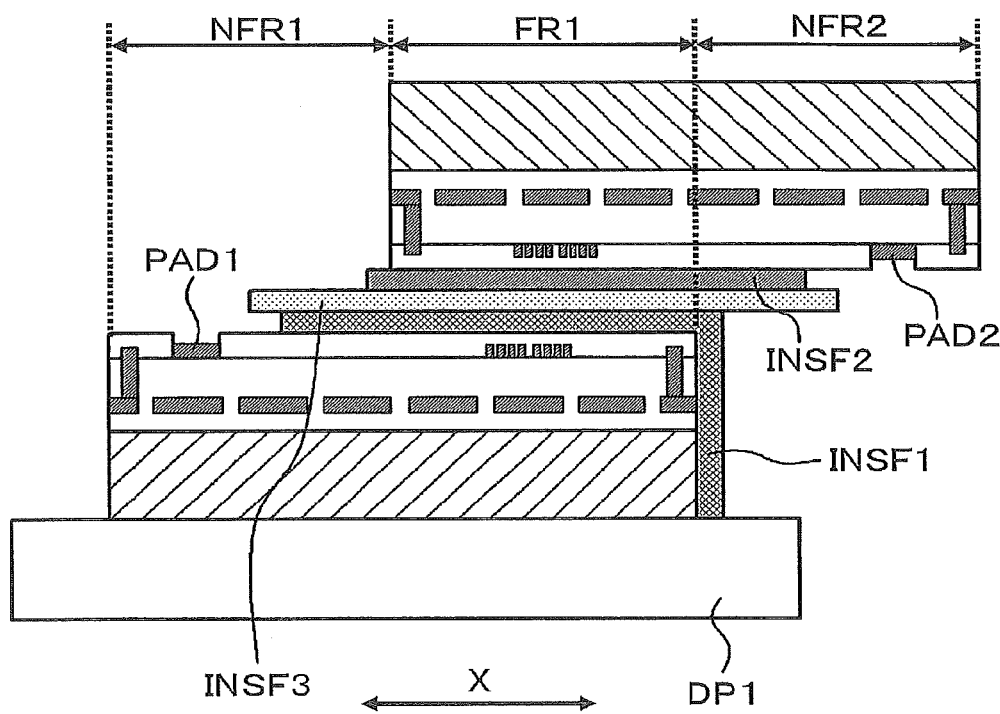

FIGS. 10A and 10B are cross-sectional views illustrating a configuration of a semiconductor device SD according to Modified Example 2. FIG. 10A corresponds to cross-section B-B' of FIG. 2, and FIG. 10B corresponds to cross-section A-A' of FIG. 2. The semiconductor device SD according to the present modified example has the same configuration as that of the semiconductor device SD according to Modified Example 2, except that a third insulating film INSF3 is included.

The third insulating film INSF3 is located between the first insulating film INSF1 and the second insulating film INSF2. The third insulating film INSF3 is formed of, for example, a DAF. In the example shown in the drawing, the edge of the third insulating film INSF3 protrudes throughout the entire circumference thereof from the facing region FR1 in which the first semiconductor chip SC1 and the second semiconductor chip SC2 face each other. However, a portion of the edge of the third insulating film INSF3 may overlap the edge of the facing region FR1, and may be located inside the facing region FR1.

In the present modified example, the same effect as that of Modified Example 1 is also obtained. In addition, since the third insulating film INSF3 is provided between the first insulating film INSF1 and the second insulating film INSF2, it is possible to further increase a withstand voltage between the first semiconductor chip SC1 and the second semiconductor chip SC2. In addition, since at least a portion of the edge of the third insulating film INSF3 does not overlap the facing region FR1, the interface (for example, interface between the first insulating film INSF1 and the sealing resin MDR) from the first semiconductor chip SC1 to the second semiconductor chip SC2 increases in length. Therefore, it is possible to further prevent a dielectric breakdown from occurring between the first semiconductor chip SC1 and the second semiconductor chip SC2, with such an interface as a starting point.

Modified Example 3

Figure 11:
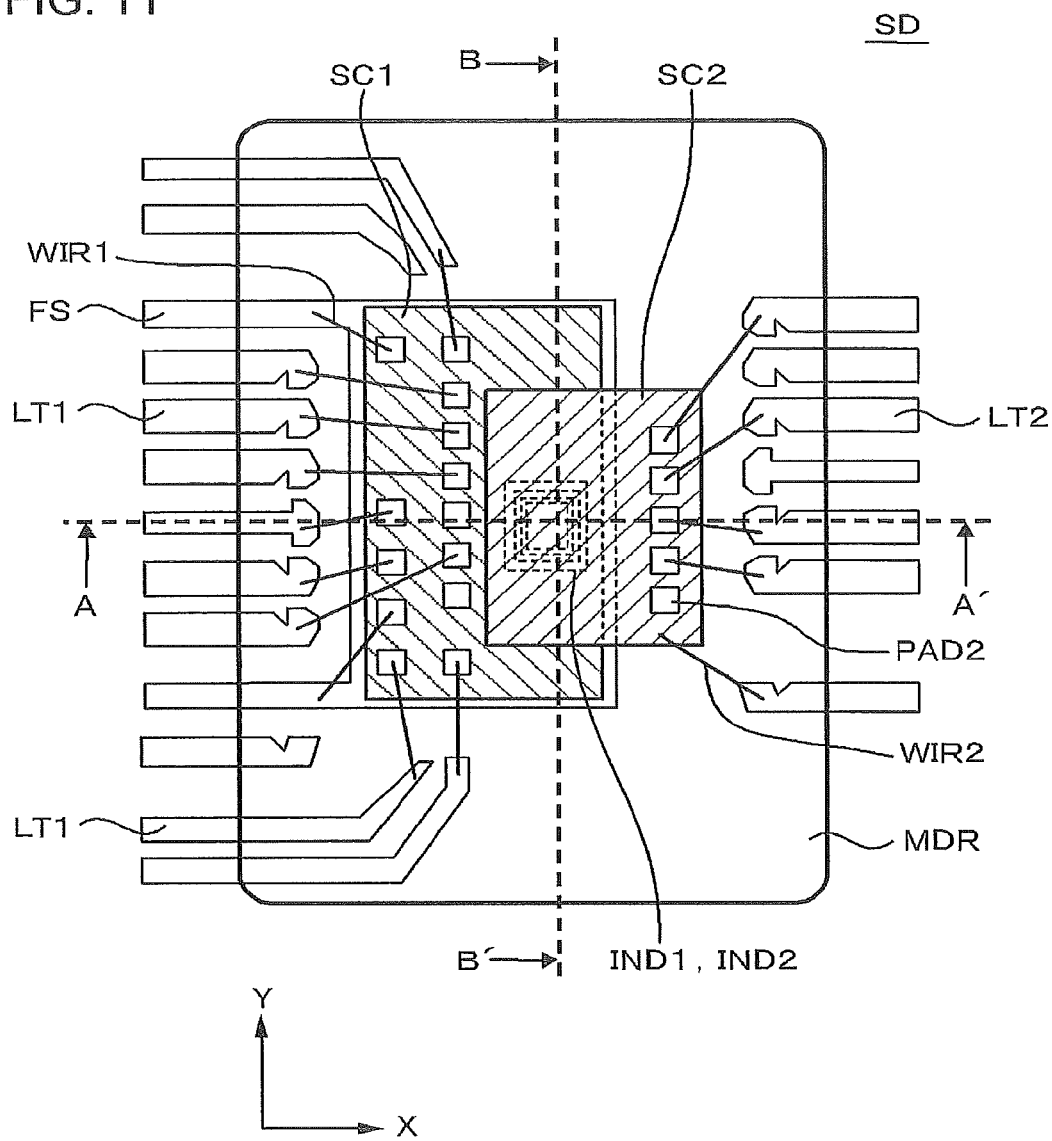
FIG. 11 is a plan view illustrating a configuration of a semiconductor device according to Modified Example 3.

FIG. 11 is a plan view illustrating a configuration of a semiconductor device SD according to Modified Example 3, and corresponds to FIG. 2 in the embodiment. The semiconductor device SD according to the present modified example has the same configuration as that of the semiconductor device SD according to the embodiment, except that the width of the second semiconductor chip SC2 is smaller than the width of the first semiconductor chip SC1 in the Y direction (second direction). In the present modified example, the width of the first insulating film INSF1 in the Y direction is different from the width of the second semiconductor chip SC2. When the width of the first insulating film INSF1 is larger than the width of the second semiconductor chip SC2, the width of the first insulating film INSF1 may be smaller than, the same as, or larger than the width of the first semiconductor chip SC1. Meanwhile, when the width of the first insulating film INSF1 is set to be equal to or less than the width of the first semiconductor chip SC1, it is possible to suppress an increase in the width of the semiconductor device SD in the Y direction.

According to the present modified example, even when the width of the second semiconductor chip SC2 is smaller than the width of the first semiconductor chip SC1, the same effect as that of the embodiment is obtained.

Modified Example 4

FIGS. 12A and 12B are cross-sectional views illustrating a configuration of a semiconductor device SD according to Modified Example 4. FIG. 12A corresponds to cross-section B-B' of FIG. 2, and FIG. 12B corresponds to cross-section A-A' of FIG. 2. The semiconductor device SD according to the present modified example has the same configuration as that of the semiconductor device SD according to the embodiment, except for the size and shape of the first insulating film INSF1.

As shown in FIG. 12A, in the present modified example, the width of the first insulating film INSF1 is smaller than the width of the facing region FR1 in the Y direction (second direction). For this reason, both two ends of the first insulating film INSF1 are located inside the facing region FR1. In the example shown in the drawing, the width of the first insulating film INSF1 is smaller than any of the width of the first semiconductor chip SC1 and the width of the second semiconductor chip SC2.

In addition, as shown in FIG. 12B, in the present modified example, the end of the first insulating film INSF1 on the first non-facing region NFR1 side substantially overlaps a portion of the edge of the second semiconductor chip SC2 which is located on the opposite side to the second electrode pad PAD2, in the X direction (first direction). In addition, the end of the first insulating film INSF1 on the second non-facing region NFR2 side substantially overlaps a portion of the edge of the first semiconductor chip SC1 which is located on the opposite side to the first electrode pad PAD1.

In the present modified example, the same effect as that of the embodiment is also obtained.

Modified Example 5

Figure 13A:
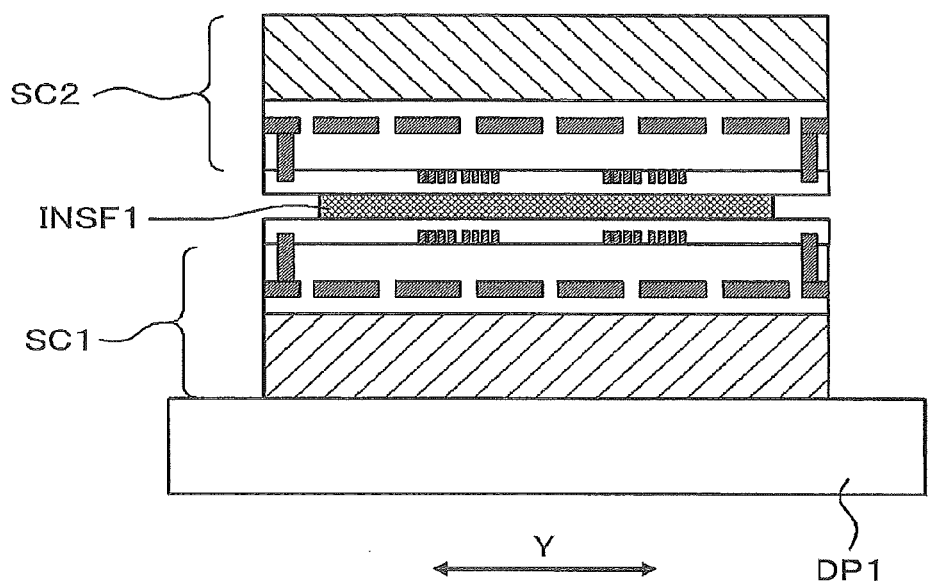
FIGS. 13A and 13B are cross-sectional views illustrating a configuration of a semiconductor device according to Modified Example 5.
Figure 13B:
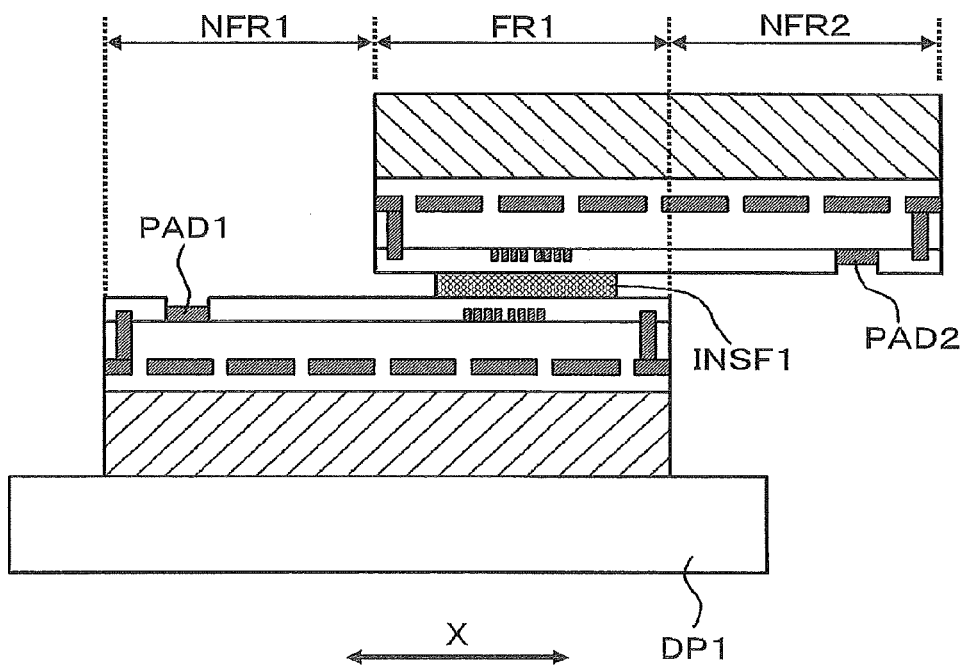

FIGS. 13A and 13B are cross-sectional views illustrating a configuration of a semiconductor device SD according to Modified Example 5. FIG. 13A corresponds to cross-section B-B' of FIG. 2, and FIG. 13B corresponds to cross-section A-A' of FIG. 2. The semiconductor device SD according to the present modified example has the same configuration as that of the semiconductor device SD shown in FIGS. 12A and 12B, except for the size of the first insulating film INSF1 in the X direction (first direction).

As shown in FIG. 13A, the configuration of the semiconductor device SD in the Y direction (second direction) is the same as that of Modified Example 4. On the other hand, as shown in FIG. 13B, in the present modified example, the width of the first insulating film INSF1 is smaller than the width of the facing region FR1 in the X direction (first direction). For this reason, both two ends of the first insulating film INSF1 are located inside the facing region FR1.

In the present modified example, the same effect as that of the embodiment is also obtained.

Modified Example 6

Figure 14A:
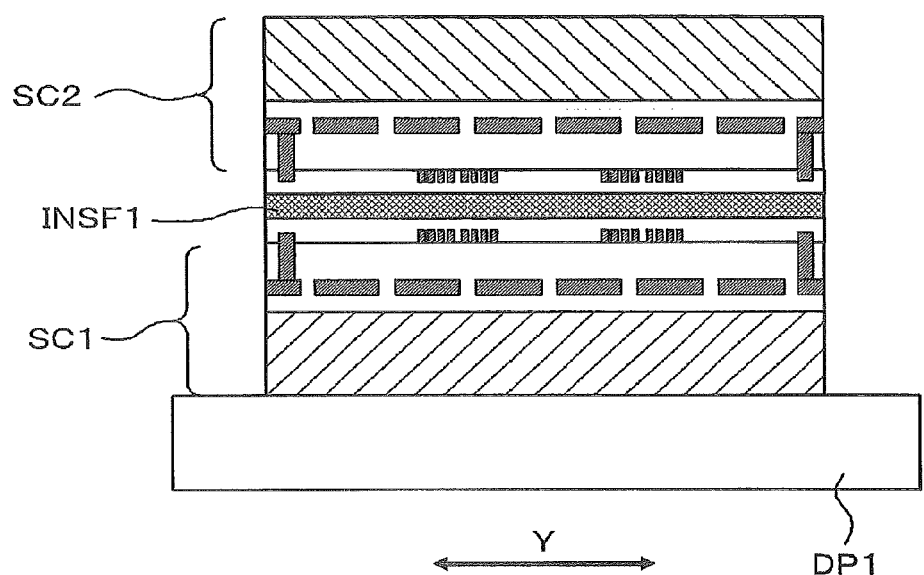
FIGS. 14A and 14B are cross-sectional views illustrating a configuration of a semiconductor device according to Modified Example 6.
Figure 14B:
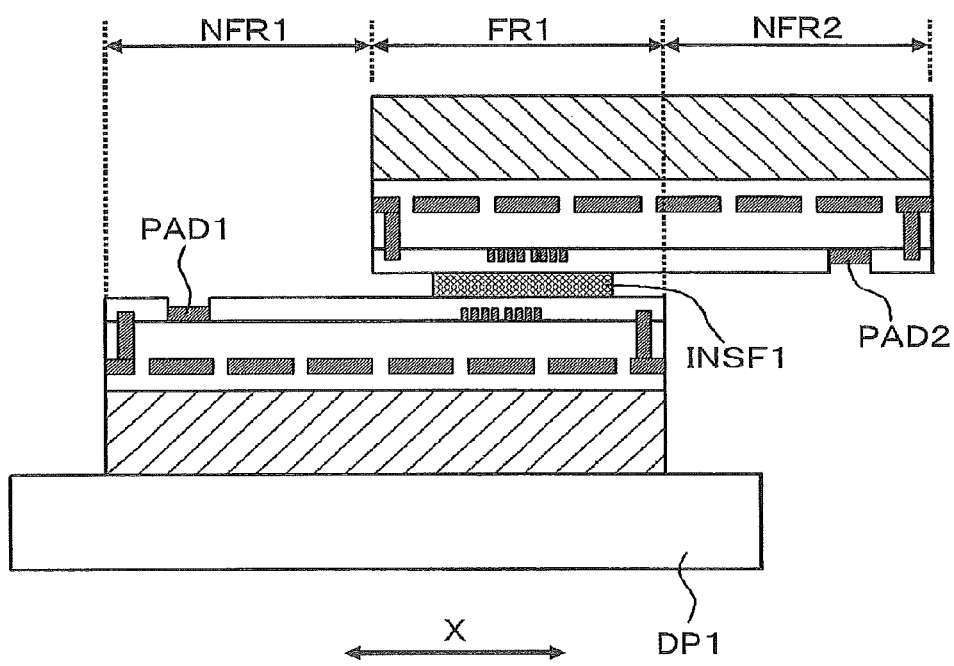

FIGS. 14A and 14B are cross-sectional views illustrating a configuration of a semiconductor device SD according to Modified Example 6. FIG. 14A corresponds to cross-section B-B' of FIG. 2, and FIG. 14B corresponds to cross-section A-A' of FIG. 2. The semiconductor device SD according to the present modified example has the same configuration as that of the semiconductor device SD shown in FIGS. 13A and 13B, except for the size of the first insulating film INSF1 in the Y direction (second direction).

In the present modified example, as shown in FIG. 14A, the end of the first insulating film INSF1 substantially overlaps the edge of the facing region FR1 in the Y direction (second direction).

In the present modified example, the same effect as that of the embodiment is also obtained.

Modified Example 7

Figure 15A:
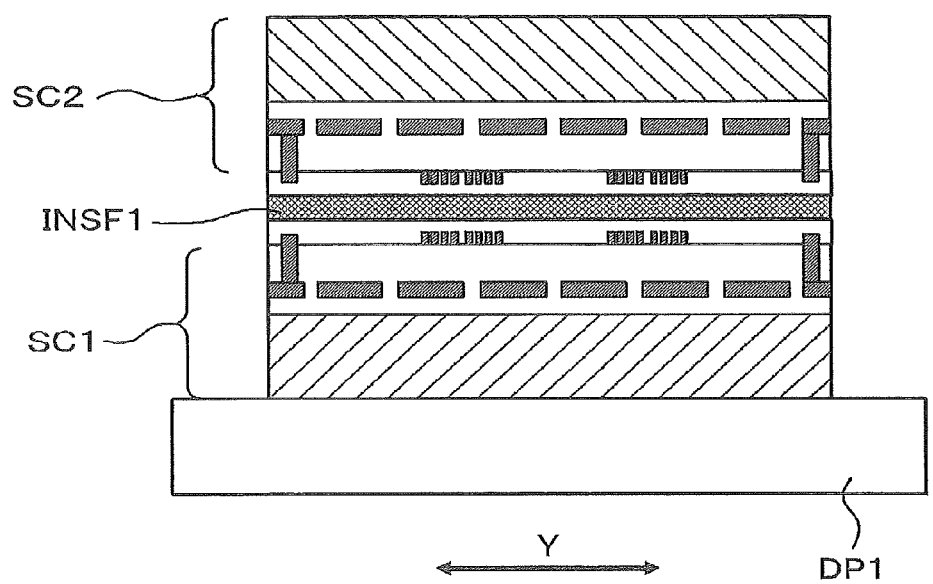
FIGS. 15A and 15B are cross-sectional views illustrating a configuration of a semiconductor device according to Modified Example 7.
Figure 15B:
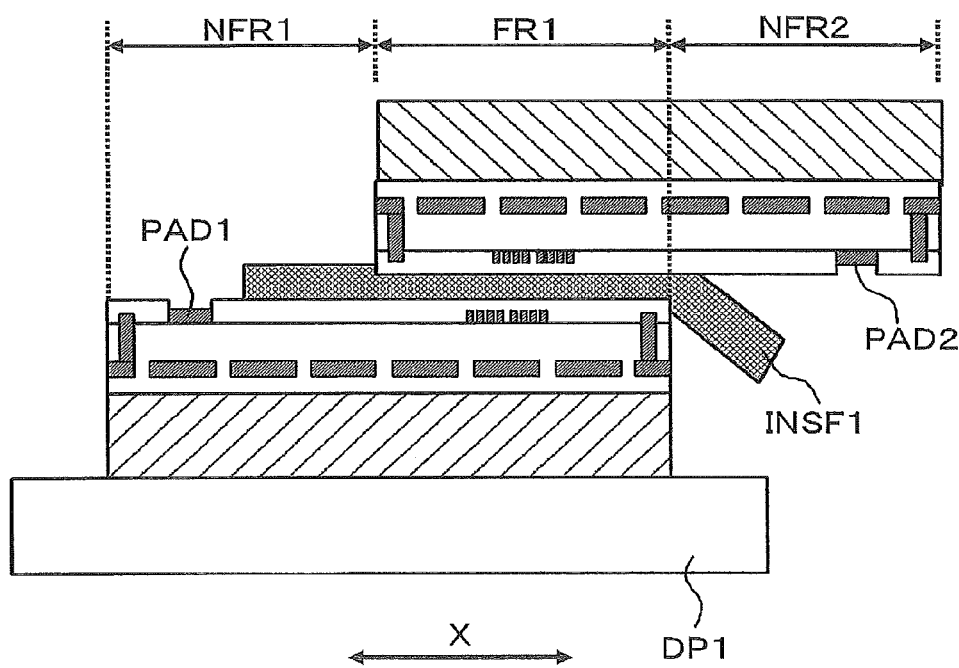

FIGS. 15A and 15B are cross-sectional views illustrating a configuration of a semiconductor device SD according to Modified Example 7. FIG. 15A corresponds to cross-section B-B' of FIG. 2, and FIG. 15B corresponds to cross-section A-A' of FIG. 2. The semiconductor device SD according to the present modified example has the same configuration as that of the semiconductor device SD shown in FIGS. 14A and 14B, except for the size of the first insulating film INSF1 in the X direction (first direction).

In the present modified example, as shown in FIG. 15B, both ends of the first insulating film INSF1 are located outside the facing region FR1 in the X direction. The end of the first insulating film INSF1 on the first non-facing region NFR1 side is located along (for example, sticks to) the surface of the first semiconductor chip SC1. On the other hand, the end of the first insulating film INSF1 on the second non-facing region NFR2 side is bent in a direction facing the lateral side of the first semiconductor chip SC1. However, this end does not come into contact with the lateral side of the first semiconductor chip SC1.

In the present modified example, the same effect as that of the embodiment is also obtained.

Modified Example 8

FIGS. 16A and 16B are cross-sectional views illustrating a configuration of a semiconductor device SD according to Modified Example 8. FIG. 16A corresponds to cross-section B-B' of FIG. 2, and FIG. 16B corresponds to cross-section A-A' of FIG. 2. The semiconductor device SD according to the present modified example has the same configuration as that of the semiconductor device SD shown in FIGS. 15A and 15B, except that, as shown in FIG. 16B, the end of the first insulating film INSF1 on the second non-facing region NFR2 side comes into contact with the lateral side of the first semiconductor chip SC1 in the X direction (first direction).

In the present modified example, the same effect as that of the embodiment is also obtained.

Modified Example 9

FIGS. 17A and 17B are cross-sectional views illustrating a configuration of a semiconductor device SD according to Modified Example 9. FIG. 17A corresponds to cross-section B-B' of FIG. 2, and FIG. 17B corresponds to cross-section A-A' of FIG. 2. The semiconductor device SD according to the present modified example has the same configuration as that of the semiconductor device SD according to the embodiment, except for the size and shape of the first insulating film INSF1.

First, as shown in FIG. 17A, a portion of the first insulating film INSF1 which protrudes from the facing region FR1 in the Y direction (second direction) is not bent. As shown in FIG. 17B, the configuration of the first insulating film INSF1 in the X direction (first direction) is the same as that of Modified Example 4 shown in FIGS. 12A and 12B.

In the present modified example, the same effect as that of the embodiment is also obtained.

Modified Example 10

Figure 18A:
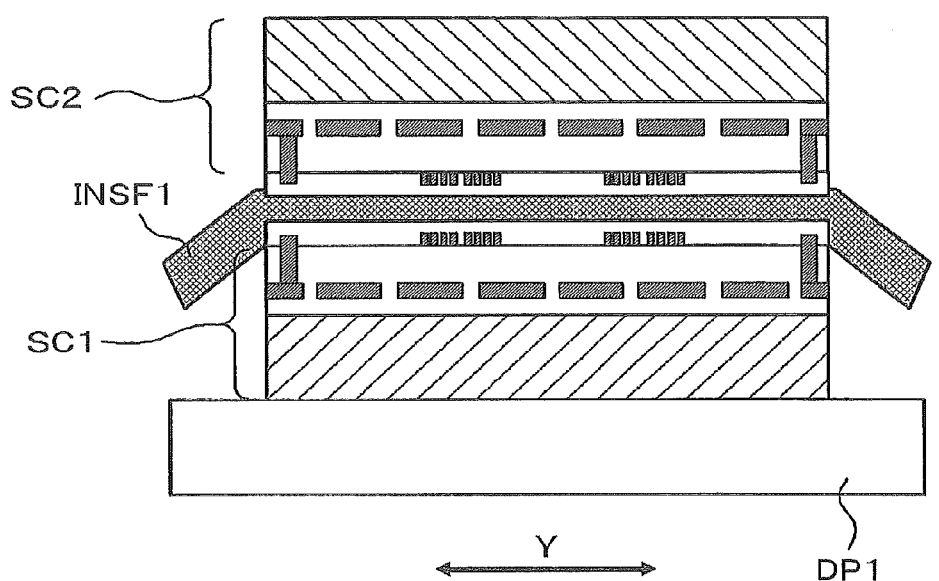
FIGS. 18A and 18B are cross-sectional views illustrating a configuration of a semiconductor device according to Modified Example 10.
Figure 18B:
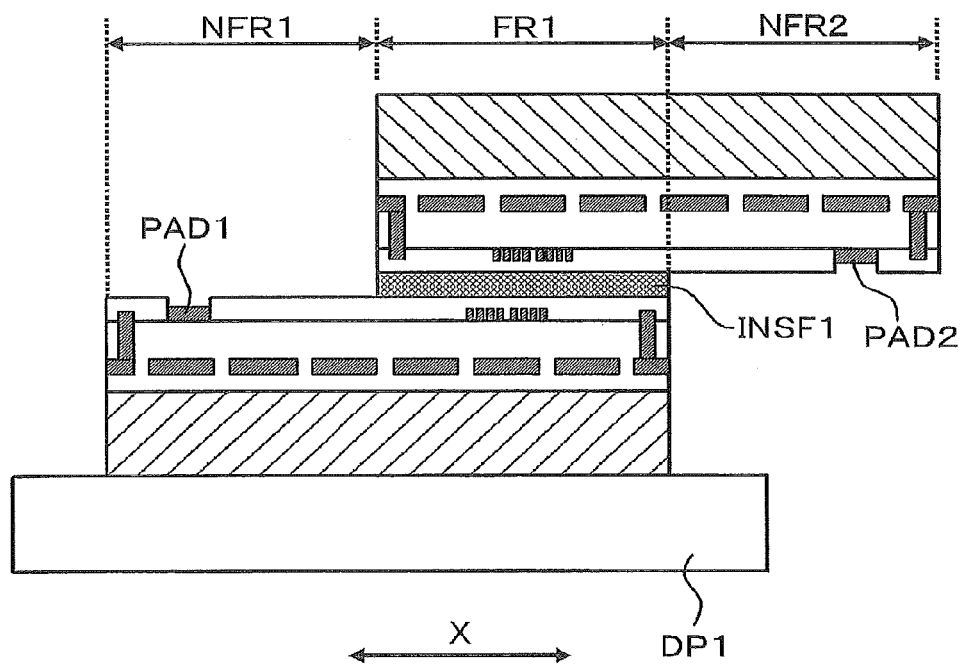

FIGS. 18A and 18B are cross-sectional views illustrating a configuration of a semiconductor device SD according to Modified Example 10. FIG. 18A corresponds to cross-section B-B' of FIG. 2, and FIG. 18B corresponds to cross-section A-A' of FIG. 2. The semiconductor device SD according to the present modified example has the same configuration as that of the semiconductor device SD according to Modified Example 9 shown in FIGS. 17A and 17B, except that, as shown in FIG. 18A, a portion of the first insulating film INSF1 which protrudes from the facing region FR1 in the Y direction (second direction) is bent toward the first semiconductor chip SC1, as is the case with the embodiment.

In the present modified example, the same effect as that of the embodiment is also obtained.

Modified Example 11

FIGS. 19A and 19B are cross-sectional views illustrating a configuration of a semiconductor device SD according to Modified Example 11. FIG. 19A corresponds to cross-section B-B' of FIG. 2, and FIG. 19B corresponds to cross-section A-A' of FIG. 2. The semiconductor device SD according to the present modified example has the same configuration as that of the semiconductor device SD according to Modified Example 10 which is shown in FIGS. 18A and 18B, except that, as shown in FIG. 19A, a portion of the first insulating film INSF1 which protrudes from the facing region FR1 in the Y direction (second direction) comes into contact with the lateral side of the first semiconductor chip SC1. Meanwhile, the portion of the first insulating film INSF1 which comes into contact with the lateral side of the first semiconductor chip SC1 may reach the chip mounting portion DP1.

In the present modified example, the same effect as that of the embodiment is also obtained.

Modified Example 12

Figure 20A:
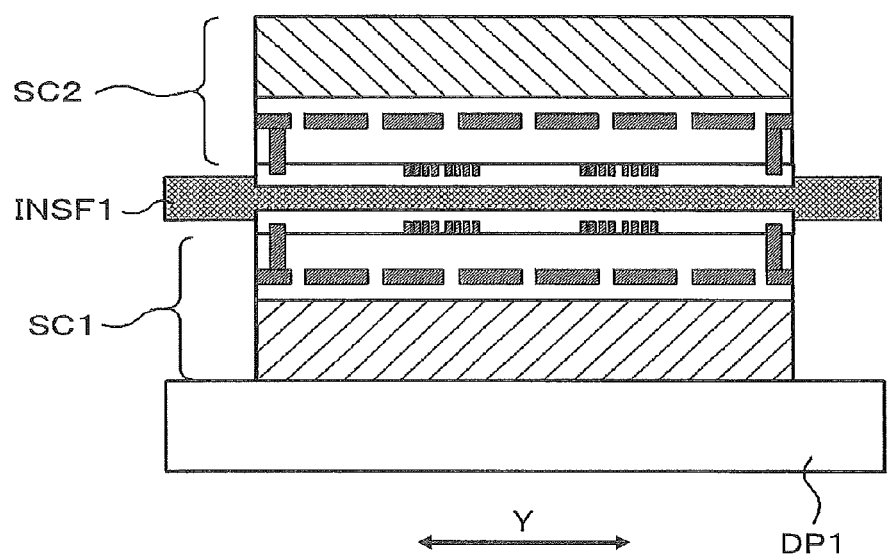
FIGS. 20A and 20B are cross-sectional views illustrating a configuration of a semiconductor device according to Modified Example 12.
Figure 20B:
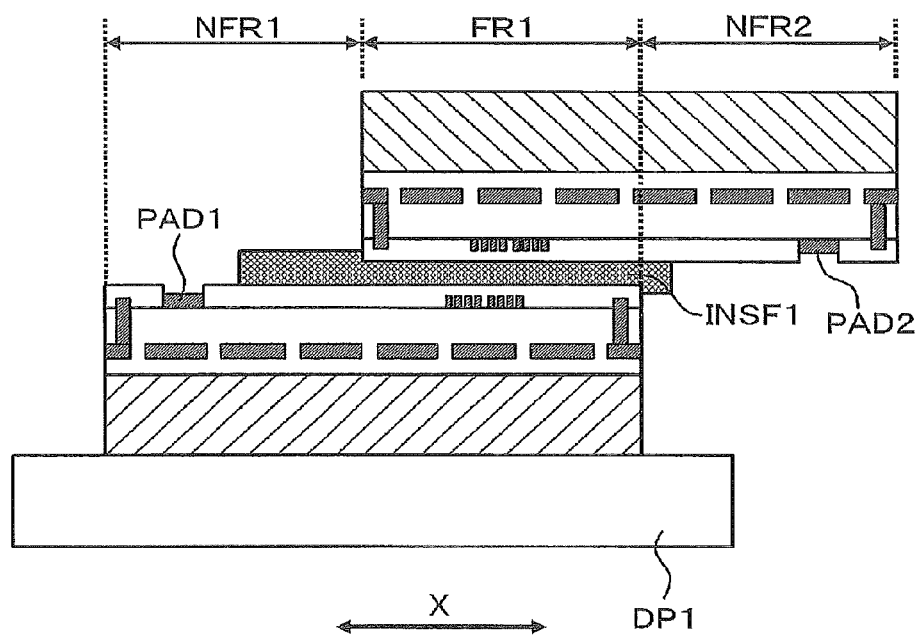

FIGS. 20A and 20B are cross-sectional views illustrating a configuration of a semiconductor device SD according to Modified Example 12. FIG. 20A corresponds to cross-section B-B' of FIG. 2, and FIG. 20B corresponds to cross-section A-A' of FIG. 2. The semiconductor device SD according to the present modified example has the same configuration as that of the semiconductor device SD according to Modified Example 9 shown in FIGS. 17A and 17B, except for the configuration of the first insulating film INSF1 in the X direction (first direction).

In the present modified example, as shown in FIG. 20B, both ends of the first insulating film INSF1 are located outside the facing region FR1. The end of the first insulating film INSF1 on the first non-facing region NFR1 side is located along the surface of the first semiconductor chip SC1, and the end of the first insulating film INSF1 on the second non-facing region NFR2 side is located along the surface of the second semiconductor chip SC2.

In the present modified example, the same effect as that of the embodiment is also obtained.

Modified Example 13

Figure 21A:
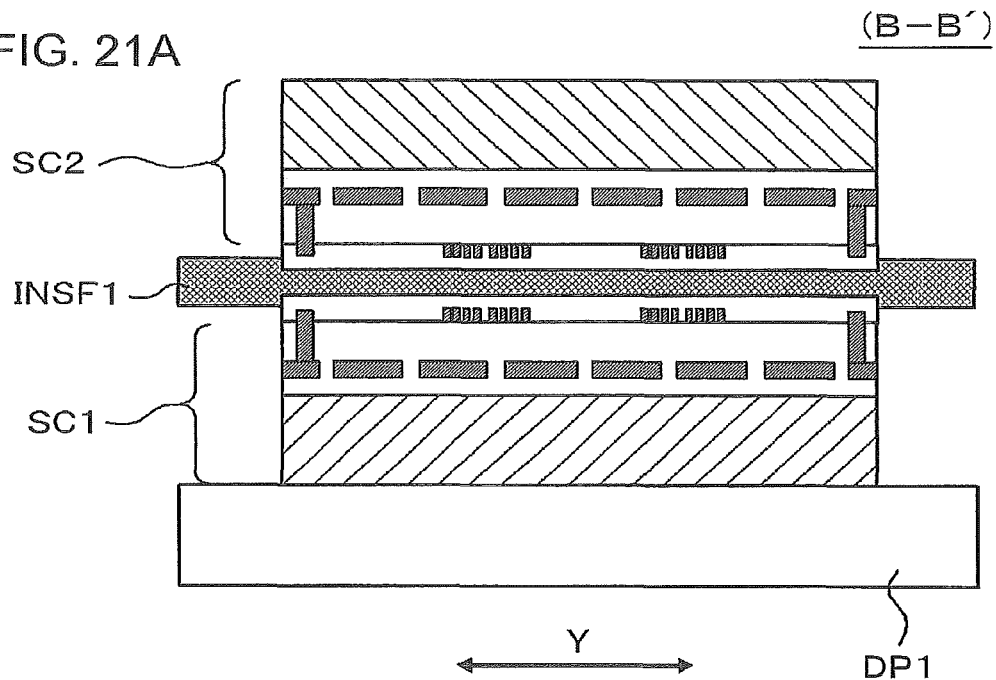
FIGS. 21A and 21B are cross-sectional views illustrating a configuration of a semiconductor device according to Modified Example 13.
Figure 21B:
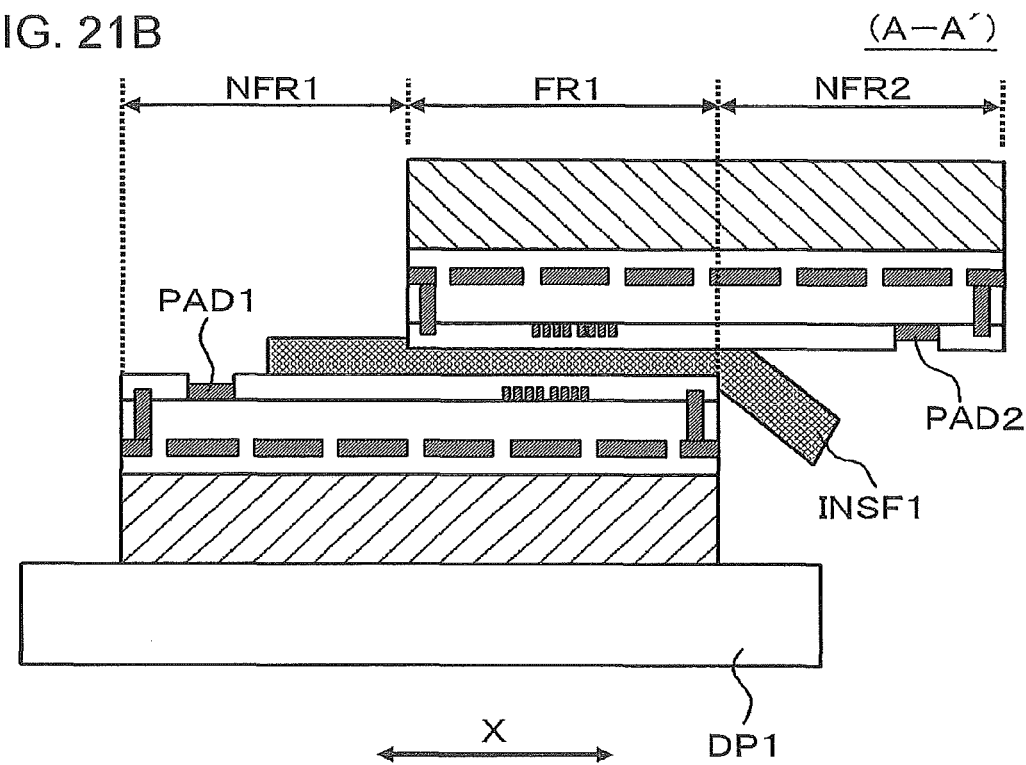

FIGS. 21A and 21B are cross-sectional views illustrating a configuration of a semiconductor device SD according to Modified Example 13. FIG. 21A corresponds to cross-section B-B' of FIG. 2, and FIG. 21B corresponds to cross-section A-A' of FIG. 2. The semiconductor device SD according to the present modified example has the same configuration as that of the semiconductor device SD according to Modified Example 12 which is shown in FIGS. 20A and 20B, except that the end of the first insulating film INSF1 on the second non-facing region NFR2 side in the X direction (first direction) is bent toward the lateral side of the first semiconductor chip SC1.

In the present modified example, the same effect as that of the embodiment is also obtained.

Modified Example 14

Figure 22A:
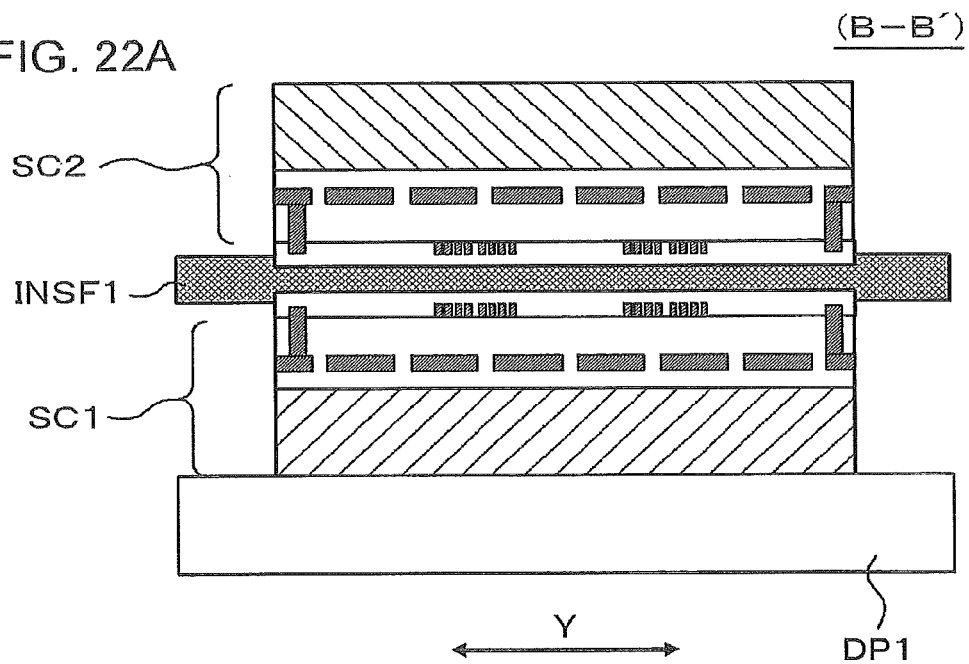
FIGS. 22A and 22B are cross-sectional views illustrating a configuration of a semiconductor device according to Modified Example 14.
Figure 22B:
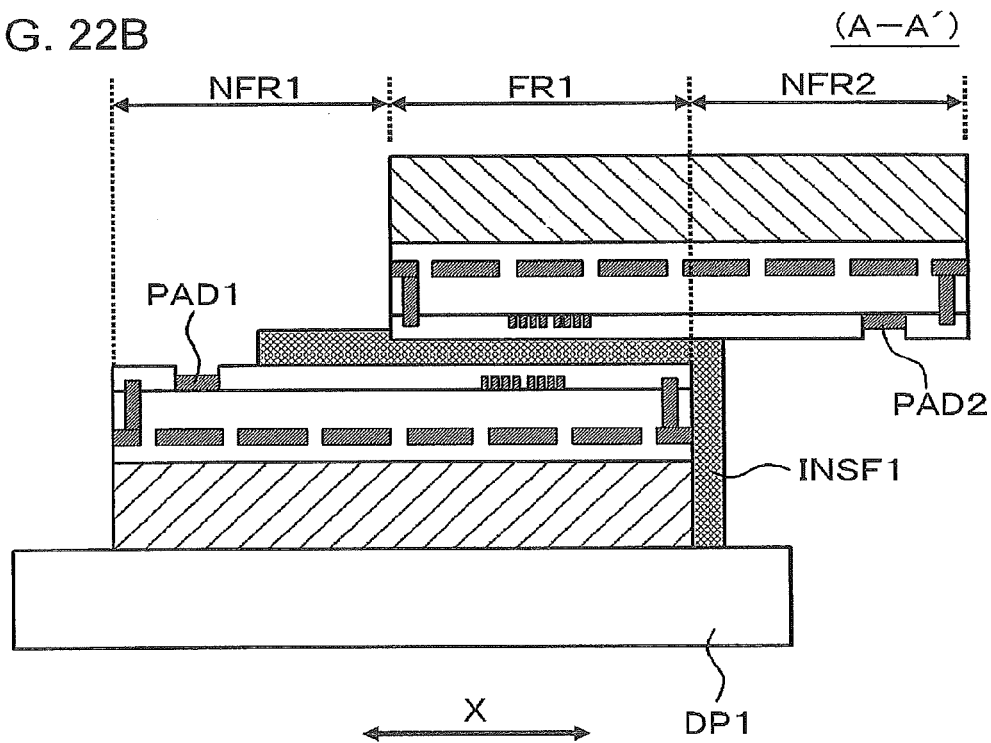

FIGS. 22A and 22B are cross-sectional views illustrating a configuration of a semiconductor device SD according to Modified Example 14. FIG. 21A corresponds to cross-section B-B' of FIG. 2, and FIG. 21B corresponds to cross-section A-A' of FIG. 2. The semiconductor device SD according to the present modified example has the same configuration as that of the semiconductor device SD according to Modified Example 12 which is shown in FIGS. 20A and 20B, except that the configuration of the first insulating film INSF1 in the X direction (first direction) is the same as the structure according to Modified Example 8 which is shown in FIG. 16B.

In the present modified example, the same effect as that of the embodiment is also obtained.

Modified Example 15

Figure 23A:
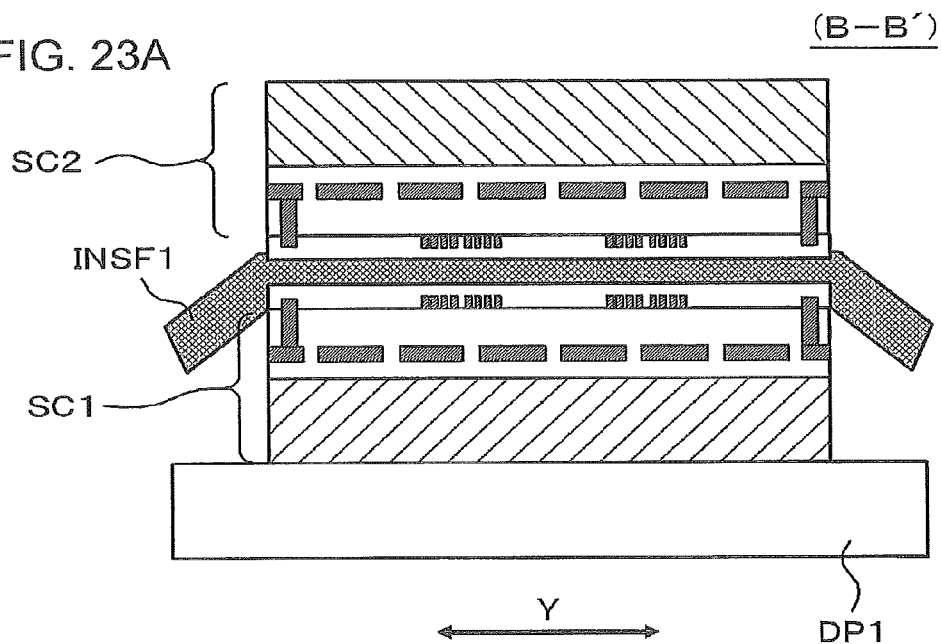
FIGS. 23A and 23B are cross-sectional views illustrating a configuration of a semiconductor device according to Modified Example 15.
Figure 23B:
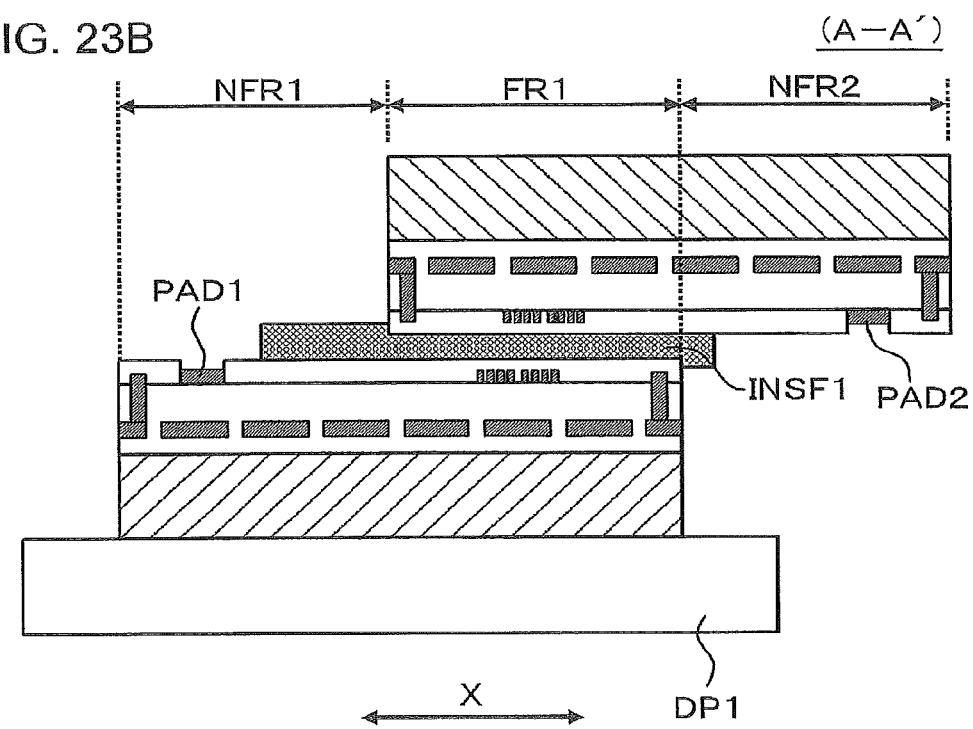

FIGS. 23A and 23B are cross-sectional views illustrating a configuration of a semiconductor device SD according to Modified Example 15. FIG. 23A corresponds to cross-section B-B' of FIG. 2, and FIG. 23B corresponds to cross-section A-A' of FIG. 2. The semiconductor device SD according to the present modified example has the same configuration as that of the semiconductor device SD according to Modified Example 10 which is shown in FIGS. 18A and 18B, except that the configuration of the first insulating film INSF1 in the X direction (first direction) is the same as the structure according to Modified Example 12 which is shown in FIG. 20B.

In the present modified example, the same effect as that of the embodiment is also obtained.

Modified Example 16

Figure 24A:
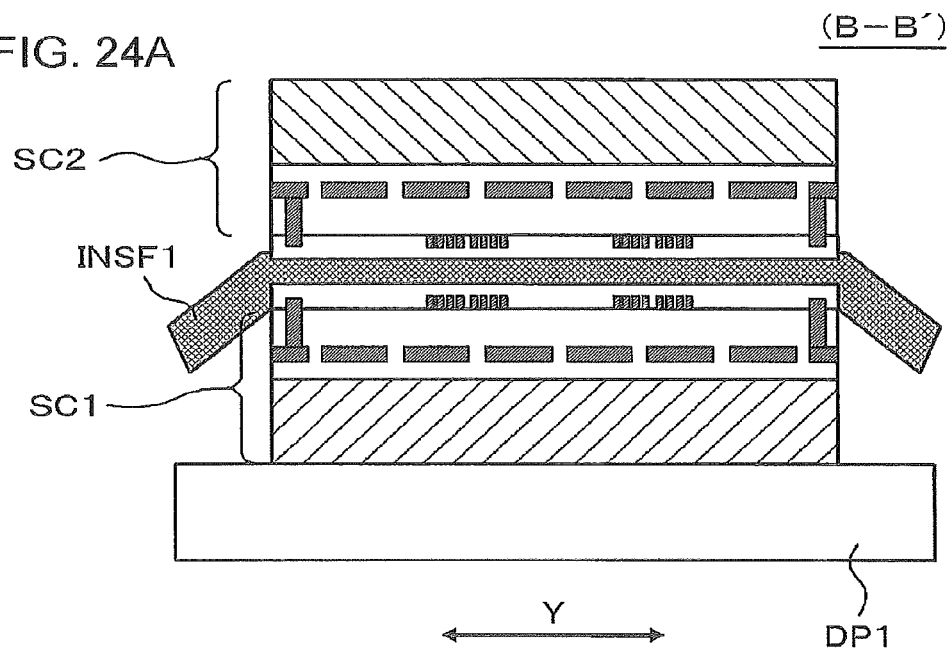
FIGS. 24A and 24B are cross-sectional views illustrating a configuration of a semiconductor device according to Modified Example 16.
Figure 24B:
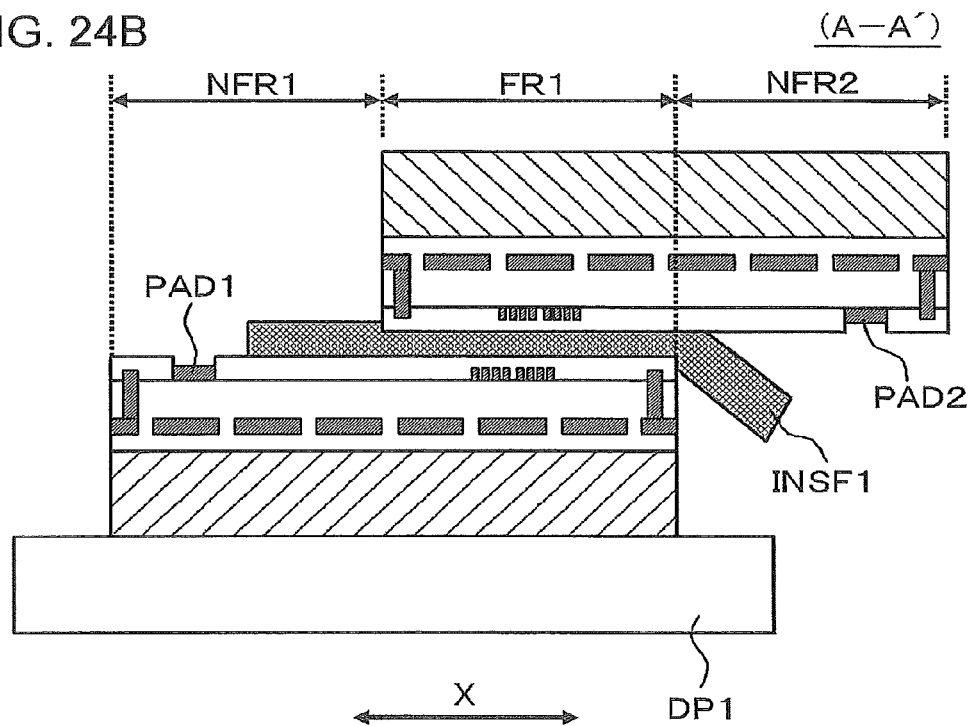

FIGS. 24A and 24B are cross-sectional views illustrating a configuration of a semiconductor device SD according to Modified Example 16. FIG. 24A corresponds to cross-section B-B' of FIG. 2, and FIG. 24B corresponds to cross-section A-A' of FIG. 2. The semiconductor device SD according to the present modified example has the same configuration as that of the semiconductor device SD according to Modified Example 10 which is shown in FIGS. 18A and 18B, except that the configuration of the first insulating film INSF1 in the X direction (first direction) is the same as the structure according to Modified Example 13 which is shown in FIG. 21B.

In the present modified example, the same effect as that of the embodiment is also obtained.

Modified Example 17

FIGS. 25A and 25B are cross-sectional views illustrating a configuration of a semiconductor device SD according to Modified Example 17. FIG. 25A corresponds to cross-section B-B' of FIG. 2, and FIG. 25B corresponds to cross-section A-A' of FIG. 2. The semiconductor device SD according to the present modified example has the same configuration as that of the semiconductor device SD according to Modified Example 11 which is shown in FIGS. 19A and 19B, except that the configuration of the first insulating film INSF1 in the X direction (first direction) is the same as the structure according to Modified Example 12 which is shown in FIG. 20B.

In the present modified example, the same effect as that of the embodiment is also obtained.

Modified Example 18

Figure 26A:
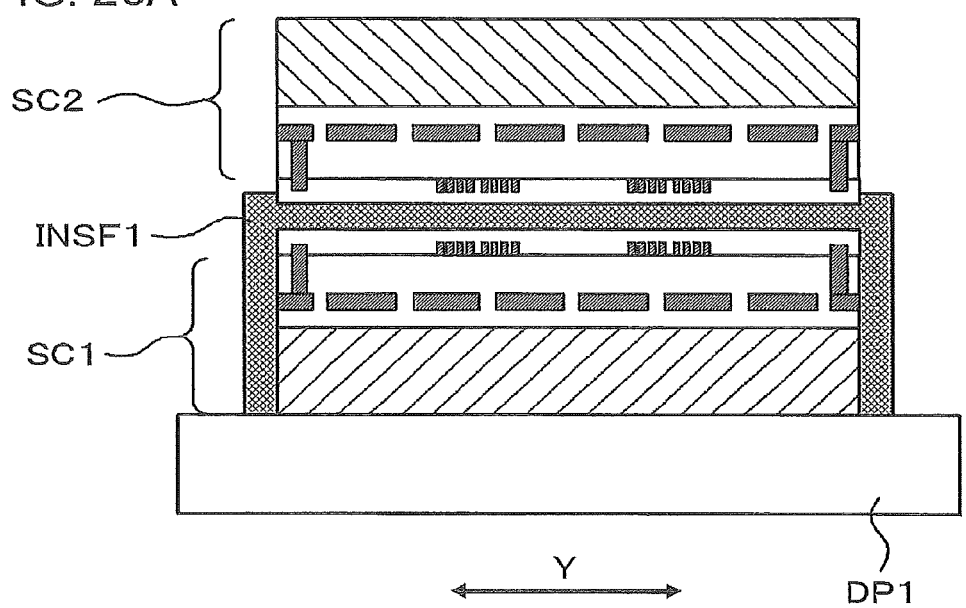
FIGS. 26A and 26B are cross-sectional views illustrating a configuration of a semiconductor device according to Modified Example 18.
Figure 26B:
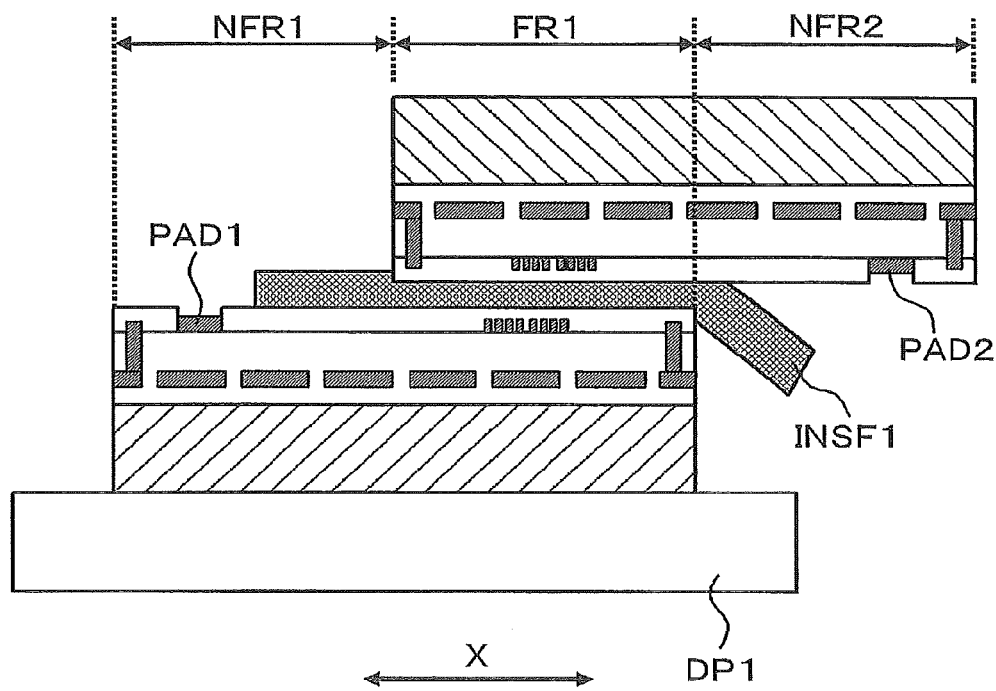

FIGS. 26A and 26B are cross-sectional views illustrating a configuration of a semiconductor device SD according to Modified Example 18. FIG. 26A corresponds to cross-section B-B' of FIG. 2, and FIG. 26B corresponds to cross-section A-A' of FIG. 2. The semiconductor device SD according to the present modified example has the same configuration as that of the semiconductor device SD according to Modified Example 11 which is shown in FIGS. 19A and 19B, except that the configuration of the first insulating film INSF1 in the X direction (first direction) is the same as the structure according to Modified Example 13 which is shown in FIG. 21B.

In the present modified example, the same effect as that of the embodiment is also obtained.

Modified Example 19

Figure 27A:
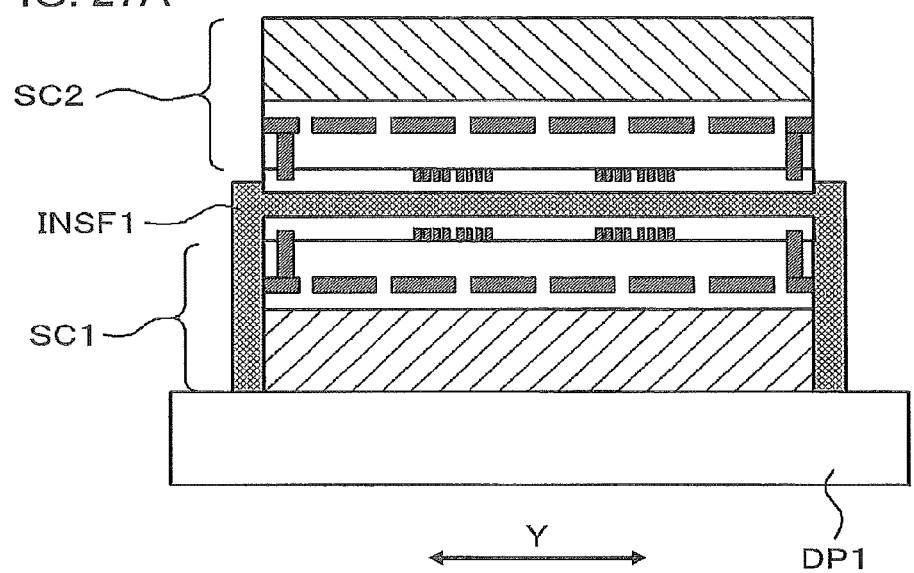
FIGS. 27A and 27B are cross-sectional views illustrating a configuration of a semiconductor device according to Modified Example 19.
Figure 27B:
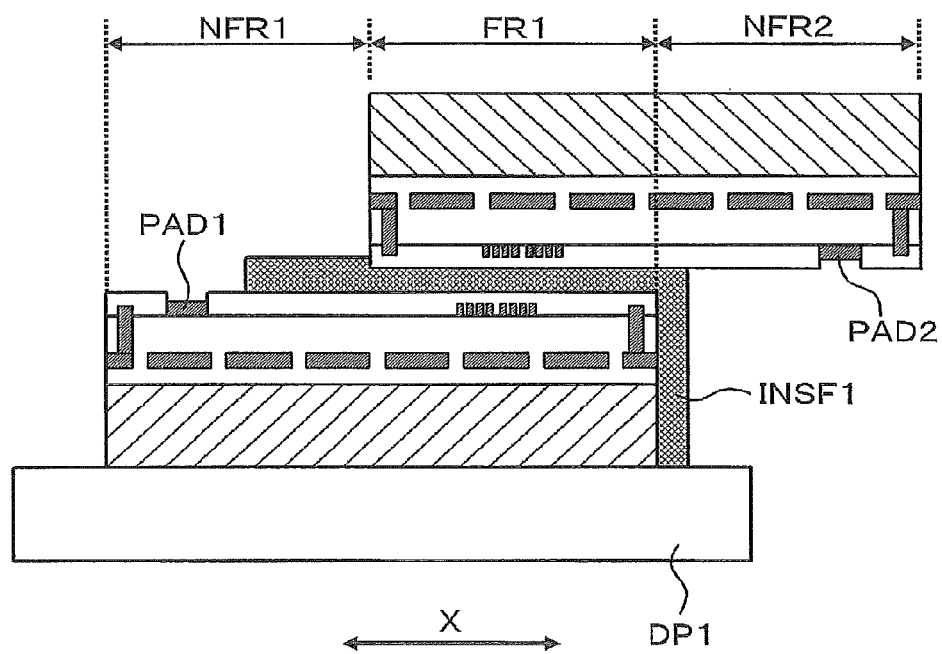

FIGS. 27A and 27B are cross-sectional views illustrating a configuration of a semiconductor device SD according to Modified Example 19. FIG. 27A corresponds to cross-section B-B' of FIG. 2, and FIG. 27B corresponds to cross-section A-A' of FIG. 2. The semiconductor device SD according to the present modified example has the same configuration as that of the semiconductor device SD according to Modified Example 11 which is shown in FIGS. 19A and 19B, except that the configuration of the first insulating film INSF1 in the X direction (first direction) is the same as the structure according to Modified Example 8 which is shown in FIG. 16B.

In the present modified example, the same effect as that of the embodiment is also obtained.

Modified Example 20

Figure 28:
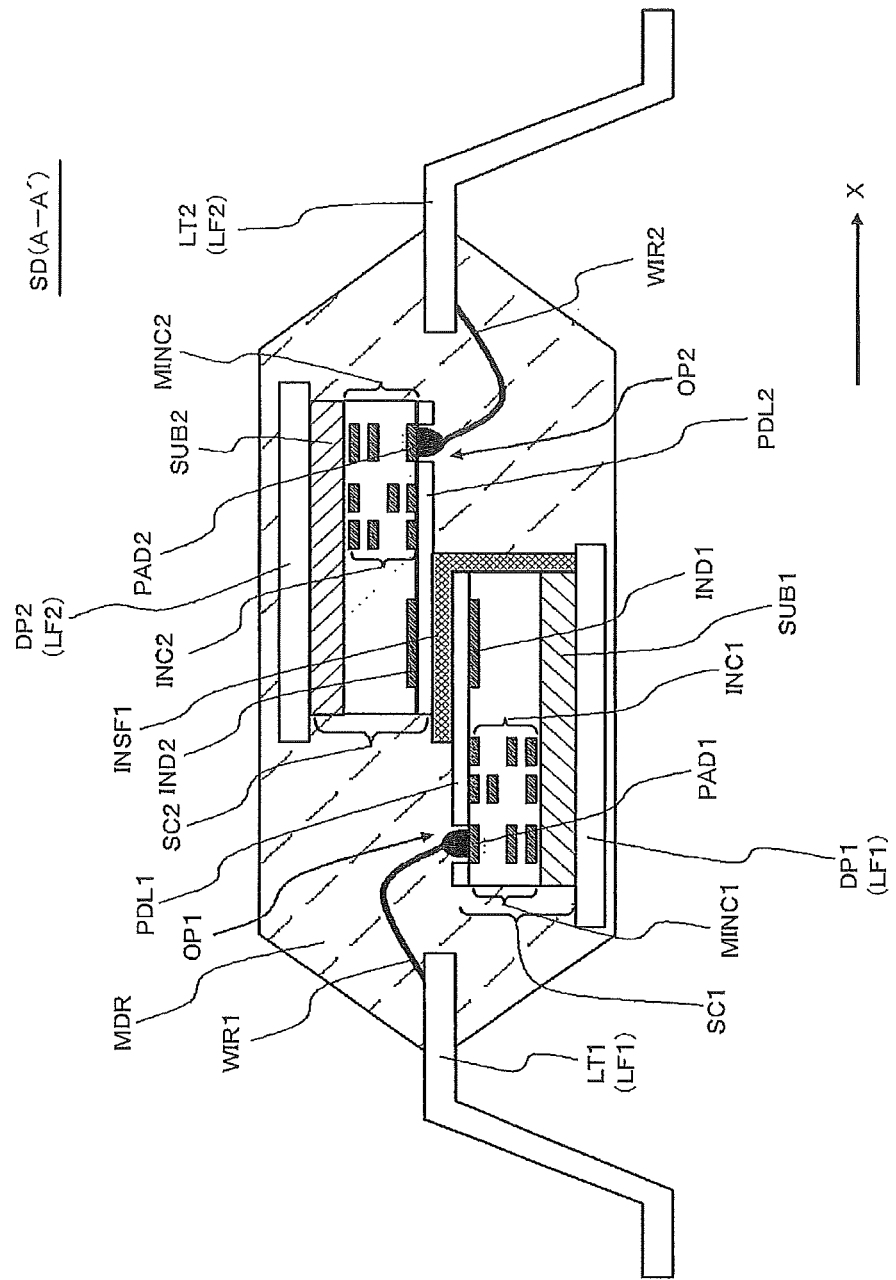
FIG. 28 is a cross-sectional view illustrating a configuration of a semiconductor device according to Modified Example 20.

FIG. 28 is a cross-sectional view illustrating a configuration of a semiconductor device SD according to Modified Example 20, and is a diagram corresponding to FIG. 1 of the embodiment. The semiconductor device SD according to the present modified example has the same configuration as that of the semiconductor device SD according to the embodiment or any of Modified Examples 1 to 20, except that a lead frame LF2 is included. Meanwhile, the drawing shows the same case as in the embodiment.

Specifically, the lead frame LF2 includes a chip mounting portion DP2 (for example, die pad). The second semiconductor chip SC2 is installed on one surface of the chip mounting portion DP2. The chip mounting portion DP2 is sealed by the sealing resin MDR. The second lead terminal LT2 is constituted by a portion of the lead frame LF2.

A method of manufacturing the semiconductor device SD according to the present modified example is the same as the method of manufacturing the semiconductor device SD according to the embodiment, except for the following points. First, the first semiconductor chip SC1 is mounted onto the chip mounting portion DP1 of the lead frame LF1. In addition, the second semiconductor chip SC2 is mounted onto the chip mounting portion DP2 of the lead frame LF2. Thereafter, the first semiconductor chip SC1 and the second semiconductor chip SC2 are caused to face each other with the first insulating film INSF1 interposed therebetween. Subsequent processes are as shown in FIG. 7B to FIG. 8C.

In the present modified example, the same effect as that of the embodiment or any of Modified Examples 1 to 20 is also obtained.

As stated above, while the present invention devised by the inventors have been described specifically based on the embodiments thereof, the present invention is not limited to the above-mentioned embodiments, and it goes without saying that various changes and modifications may be made without departing from the scope of the invention.

It is apparent that the present invention is not limited to the above embodiment, and may be modified and changed without departing from the scope and spirit of the invention.

What is claimed is:

1. A semiconductor device comprising:
a first semiconductor chip that includes a first main surface, a first inductor formed on the first main surface, and a first external connection terminal formed on the first main surface;
a second semiconductor chip that includes a second main surface, a second inductor formed on the second main surface, a second external connection terminal formed on the second main surface; and
a first insulating film that is located between the first semiconductor chip and the second semiconductor chip,
wherein the first semiconductor chip and the second semiconductor chip overlap each other such that the first main surface and the second main face each other,
the semiconductor device includes a facing region in which the first semiconductor chip and the second semiconductor chip overlap each other when seen in a plan view,
the first semiconductor chip includes a first non-facing region that does not face the second semiconductor chip,
the second semiconductor chip includes a second non-facing region that does not face the first semiconductor chip,
the first external connection terminal is disposed in the first non-facing region,
the second external connection terminal is disposed in the second non-facing region, and
the first insulating film comprises a first end that does not overlap an end of the facing region when seen from a direction perpendicular to the first semiconductor chip.

2. The semiconductor device according to claim 1, wherein the first end of the first insulating film is located inside the facing region when seen from a direction perpendicular to the semiconductor chip.

3. The semiconductor device according to claim 1, wherein the first end of the first insulating film is located outside the facing region when seen from a direction perpendicular to the semiconductor chip.

4. The semiconductor device according to claim 3, wherein the first end of the first insulating film is located outside the first semiconductor chip and the second semiconductor chip when seen from a direction perpendicular to the semiconductor chip.

5. The semiconductor device according to claim 4, wherein a portion of the first insulating film which is located outside the first semiconductor chip and the second semiconductor chip is bent in a direction facing a lateral side of the first semiconductor chip.

6. The semiconductor device according to claim 1,
wherein a first semiconductor chip comprises:
- a first side;
- a second side opposite to the first side;
- a third side between the first side and the second side; and
- a fourth side opposite to the third side, wherein the second semiconductor chip comprises:
- a fifth side;
- a sixth side opposite of the fifth side;
- a seventh side between the first, the fifth and sixth sides; and
- an eighth side opposite to the seventh side, wherein the first semiconductor chip and the second semiconductor chip are arranged such that:
- the fifth side is positioned between the first side and the second side;
- the second side is positioned between the fifth side and the sixth side;
- the seventh side is positioned between the third side and the fourth side;
- the eighth side is positioned between the seventh side and the fourth side.

7. The semiconductor device according to claim 1, further comprising a second insulating film that is located between the first insulating film and the second semiconductor chip.

8. The semiconductor device according to claim 7, further comprising a third insulating film that is located between the first insulating film and the second insulating film.

9. The semiconductor device according to claim 1, wherein the first semiconductor chip comprises a semiconductor chip for power control, and
the second semiconductor chip comprises a controller chip that controls the first semiconductor chip.

10. A semiconductor device comprising:
- a first semiconductor chip that includes a first main surface, a first inductor formed on the first main surface, and a first external connection terminal formed on the first main surface;
- a second semiconductor chip that includes a second main surface, a second inductor formed on the second main surface, and a second external connection terminal formed on the second main surface; and
- a first insulating film that is located between the first semiconductor chip and the second semiconductor chip, wherein the first semiconductor chip and the second semiconductor chip overlap each other such that the first main surface and the second main surface face each other, the semiconductor device includes a facing region in which the first inductor and the second inductor overlap each other when seen in a plan view;

the first semiconductor chip includes a first non-facing region that does not face the second semiconductor chip, the second semiconductor chip includes a second non-facing region that does not face the first semiconductor chip, the first external connection terminal is disposed in the first non-facing region, the second external connection terminal is disposed in the second non-facing region, the first insulating film comprises a first end that is located outside the first semiconductor chip and inside the second semiconductor chip when seen from a direction perpendicular to the first semiconductor chip, and the first end of the first insulating film is bent toward a lateral side of the first semiconductor chip.

11. The semiconductor device according to claim 10, further comprising a second insulating film that is located between the first insulating film and the second semiconductor chip.

12. The semiconductor device according to claim 11, further comprising a third insulating film that is located between the first insulating film and the second semiconductor chip.

* * * * *